(12) United States Patent
Anderson et al.

(10) Patent No.: US 11,415,518 B2
(45) Date of Patent: Aug. 16, 2022

(54) MAPPING AND EVALUATING GAN WAFERS FOR VERTICAL DEVICE APPLICATIONS

(71) Applicant: The Government of the United States of America, as represented by the Secretary of the Navy, Arlington, VA (US)

(72) Inventors: Travis J. Anderson, Alexandria, VA (US); Jennifer K. Hite, Arlington, VA (US); James C. Gallagher, Alexandria, VA (US); Karl D. Hobart, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 320 days.

(21) Appl. No.: 16/906,188

(22) Filed: Jun. 19, 2020

(65) Prior Publication Data

US 2020/0400578 A1    Dec. 24, 2020

Related U.S. Application Data

(60) Provisional application No. 62/864,520, filed on Jun. 21, 2019.

(51) Int. Cl.
*G01J 3/30* (2006.01)
*G01N 21/65* (2006.01)
(Continued)

(52) U.S. Cl.
CPC ......... *G01N 21/65* (2013.01); *G01N 21/9505* (2013.01); *H01L 21/0254* (2013.01); *H01L 29/2003* (2013.01); *H01L 29/66204* (2013.01); *H01L 29/861* (2013.01)

(58) Field of Classification Search
CPC .............. G01N 21/65; G01N 21/6489; G01N 21/9501; G01N 21/9505; G01N 21/35;
(Continued)

(56) References Cited

U.S. PATENT DOCUMENTS

| 6,994,750 B2 * | 2/2006 | Tatsunari | G01N 21/35 117/85 |
| 7,030,375 B1 * | 4/2006 | Testoni | H01J 49/446 378/34 |

(Continued)

OTHER PUBLICATIONS

J.K. Hite, T.J. Anderson, L.E. Luna, J.C. Gallagher, M.A. Mastro, J.A. Freitas, C.R. Eddy, "Influence of HVPE substrates on homoepitaxy of GaN grown by MOCVD," J. Cryst. Growth 498 (2018) 352-356 (doi:10.1016/j.jcrysgro.2018.06.032).

(Continued)

*Primary Examiner* — Thang X Le
(74) *Attorney, Agent, or Firm* — US Naval Research Laboratory; Joslyn B. Barritt

(57) ABSTRACT

A method for mapping and analyzing a GaN substrate to identify areas of the substrate suitable for fabrication of electronic devices thereon. Raman spectroscopy is performed over the surface of a GaN substrate to produce maps of the $E_2$ and $A_1$ peaks at a plurality of areas on the substrate surface, the $E_2$ and $A_1$ peaks being associated with known concentrations of defects and charge carriers, so that areas of the GaN substrate having relatively high resistivity or conductivity which make those areas suitable or unsuitable for fabrication of electronic devices can be identified. The devices can then be fabricated only on suitable areas of the substrate, or the size of the devices can be tailored to maximize the yield of devices fabricated thereon. Substrates not meeting a threshold level of defect and/or charge carrier concentration can be discarded without fabrication of poor-quality devices thereon.

12 Claims, 18 Drawing Sheets

(51) Int. Cl.
    *H01L 29/66* (2006.01)
    *H01L 21/02* (2006.01)
    *H01L 29/20* (2006.01)
    *H01L 29/861* (2006.01)
    *G01N 21/95* (2006.01)

(58) Field of Classification Search
    CPC .......... G01N 21/3581; G01N 21/3595; G01N 21/392; G01N 2021/646; G01N 2021/8864; G01N 2021/95676; G01N 2021/8427; H01L 21/0254; H01L 22/12; H01L 29/66204; H01L 29/2003; H01L 29/861
    See application file for complete search history.

(56) References Cited

U.S. PATENT DOCUMENTS

| | | | |
|---|---|---|---|
| 9,368,582 B2 | 6/2016 | Kizilyalli et al. | |
| 2010/0163100 A1* | 7/2010 | Goya | H01L 31/03687 438/93 |
| 2011/0237011 A1* | 9/2011 | Zhang | H01L 21/0254 438/47 |

OTHER PUBLICATIONS

J.K. Hite, T.J. Anderson, M.A. Mastro, L.E. Luna, J.C. Gallagher, R.L. Myers-Ward, K.D. Hobart, C.R. Eddy, "Effect of Surface Morphology on Diode Performance in Vertical GaN Schottky Diodes," ECS J. Solid State Sci. Technol. 6 (2017) S3103-S3105.
Isik C. Kizilyalli, P. Bui-Quang, D. Disney, H. Bhatia, and Ozgur Aktas, "Reliability studies of vertical GaN devices based on bulk GaN substrates," Microelectronics Reliability 55 (2015) 1654-1661.
T. Hossain et al., "Crack Statististics and Stress Analysis of Thick GaN on Patterned Silicon Substrate," Phys. Status Solidi B 2018, 255, 1700399.
L. T. Tung et al., "Photoluminescence and Raman studies of GaN films grown by MOCVD," Journal of Physics: Conference Series 187 (2009) 012021.
M. Kuball, "Raman spectroscopy of GaN, AlGaN and AlN for process and growth monitoring/control," Surf. Interface Anal. 2001; 31: 987-999.
Michael A. Reshchikov and Hadis Morkoç, "Luminescence properties of defects in GaN," J. Appl. Phys 97, 061301 (2005).
S. A. Church, et al., "Effect of stacking faults on the photoluminescence spectrum of zincblende GaN," Journal of Applied Physics 123, 185705 (2018).
J.C. Gallagher et al., "Long range, non-destructive characterization of GaN substrates for power devices," Journal of Crystal Growth 506 (2019) 178-184.
M. Katsikini, et al., "Comparison of Fe and Si doping of GaN: An EXAFS and Raman study," Materials Science and Engineering B 176 (2011) 723-726.
M. A. Reshchikov, et al., "Two yellow luminescence bands in undoped GaN," Scientific Reports | (2018) 8:8091 | DOI:10.1038/s41598-018-26354-z.

* cited by examiner

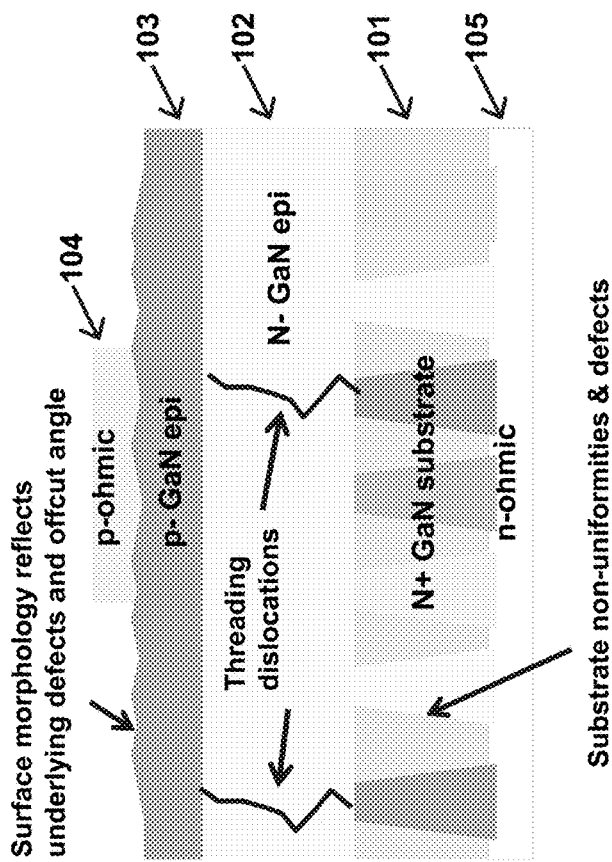
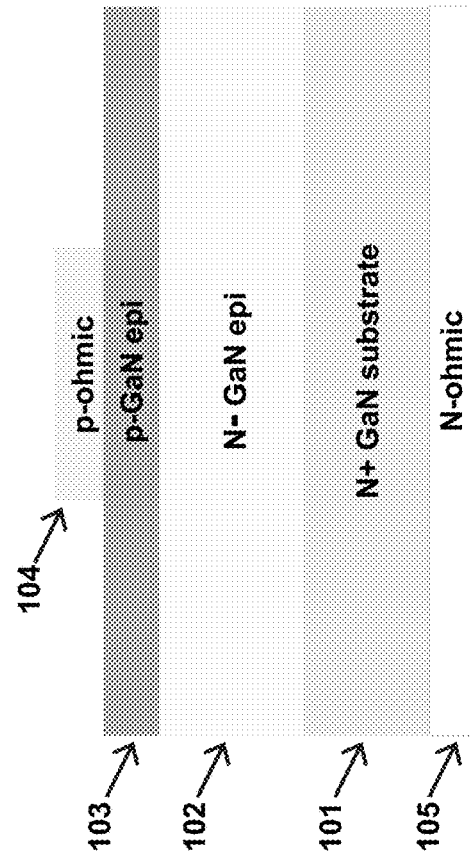
FIG. 1B
(Prior Art)
FIG. 1A

Type I (Uniform) substrates

Type II (Non-Uniform) substrates

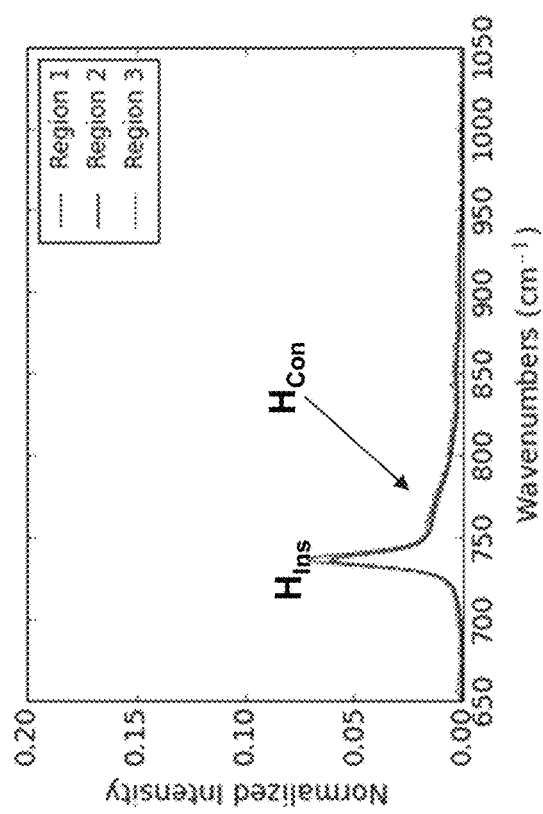
FIG. 13A
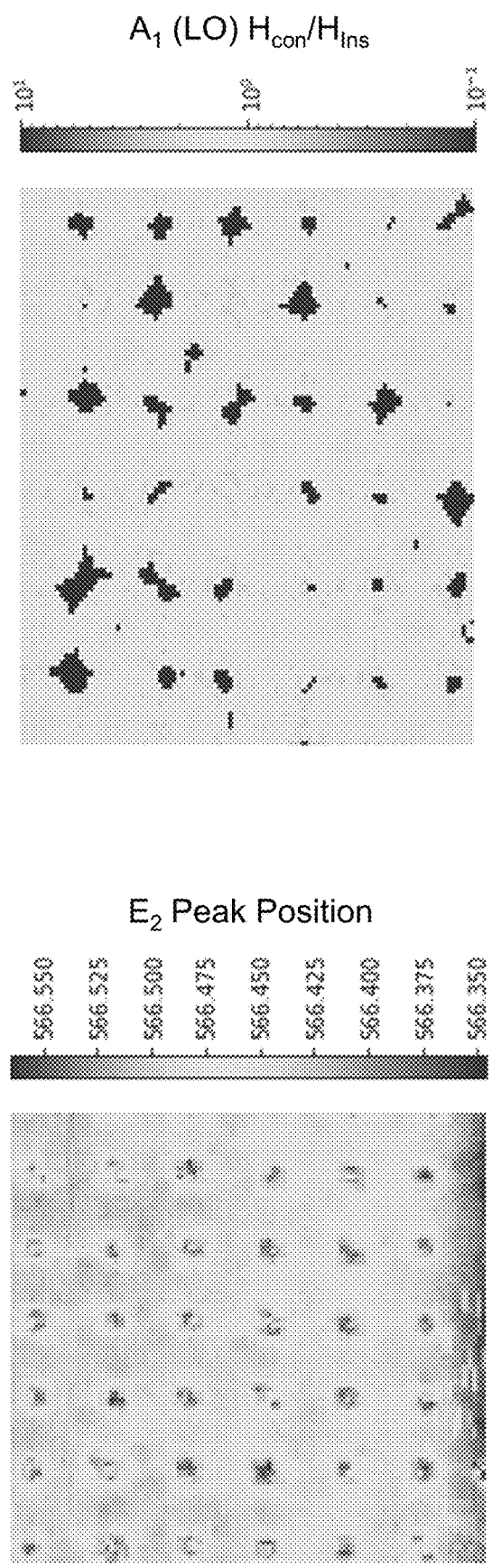
FIG. 13C
FIG. 13B

MAPPING AND EVALUATING GAN WAFERS FOR VERTICAL DEVICE APPLICATIONS

CROSS-REFERENCE

This application is a Nonprovisional of and claims the benefit of priority under 35 U.S.C. § 119 based on U.S. Provisional Patent Application No. 62/864,520 filed on Jun. 21, 2019. The Provisional application and all references cited therein and in the present application are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #111170.

TECHNICAL FIELD

The present invention relates to evaluation and fabrication of electronic devices, particularly to evaluation of GaN wafers to determine their suitability for use in vertical device applications.

BACKGROUND

As a wide bandgap semiconductor, the GaN materials system represents a critical technology for next-generation electronics in many applications due to the high breakdown field, high mobility, and chemical and thermal stability.

It is well known that GaN-based technology should theoretically lead to the development of electrical devices having higher quality than can be achieved using Si or SiC due to due to GaN's larger Baligia figure of merit, which is a figure of merit for power switching devices. Fundamentally this means that GaN devices will exhibit a lower specific ON-resistance compared to a Si or SiC device rated at the same voltage.

GaN-based vertical electronic devices such as P-i-N diodes, Schottky barrier diodes, junction barrier Schottky (JBS) diodes, current aperture vertical electron transistor (CAVET), p-n junction gated field effect transistor (JFET), and metal oxide semiconductor field effect transistor (MOSFET) are of significant interest for next-generation power switching technology.

However, it has been shown that the differences in long range properties of the GaN substrate can decrease the quality of homoepitaxial films deposited thereon and thus can degrade the performance of vertical Schottky diodes fabricated on such substrates. See J. K. Hite, T. J. Anderson, L. E. Luna, J. C. Gallagher, M. A. Mastro, J. A. Freitas, C. R. Eddy, "Influence of HVPE substrates on homoepitaxy of GaN grown by MOCVD," *J. Cryst. Growth* 498 (2018) 352-356 (doi:10.1016/j.jcrysgro.2018.06.032); and J. K. Hite, T. J. Anderson, M. A. Mastro, L. E. Luna, J. C. Gallagher, R. L. Myers-Ward, K. D. Hobart, C. R. Eddy, "Effect of Surface Morphology on Diode Performance in Vertical GaN Schottky Diodes," *ECS J. Solid State Sci. Technol.* 6 (2017) S3103-S3105.

Vertical GaN devices have exhibited poor reliability under accelerated stress testing, often failing high temperature operating life for unknown reasons. In such cases, while there is typically no change in breakdown voltage related to ON-resistance, there is an increase in leakage current.

The block schematics in FIGS. 1A and 1B illustrate the structures of an exemplary vertical device that can be fabricated on a GaN substrate.

The block schematic in FIG. 1A illustrates an ideal vertical GaN diode comprising a defect-free N+ GaN substrate 101, an N− GaN epitaxial layer 102 formed on an upper surface of substrate 101, a P-GaN epitaxial layer 103 formed on an upper surface of N− layer 102, and P- and N-ohmic contacts 104 and 105 formed on the top and bottom of the device. In the absence of material defects, and with proper device design such as doping levels and edge termination, as described above, the device will exhibit lower specific ON-resistance and other improved properties as compared to devices based on Si.

The block schematic in FIG. 1B illustrates aspects of an actual, i.e., non-ideal, vertical GaN diode in accordance with the prior art. Such actual structures can include non-uniformities and/or defects in the N+ GaN material forming substrate 101, extended defects in N− GaN epilayer 102, and an uneven surface morphology in the topmost p-GaN epi layer 103 resulting from the defects of the underlying layers and/or from irregularities in the offcut angle of the topmost layer. These defects can affect the way in which top and bottom p- and N-ohmic contacts 104 and 105 contact the structure, and can alter the surface and internal electric field distribution, leading to excessive leakage current, premature breakdown, or poor reliability.

These irregularities and defects have a demonstrable effect on the current leakage of a device fabricated on such a substrate. This is illustrated by the current leakage map in FIG. 2, which shows the results of an investigation by Isik Kizilyalli et al. of the effects of surface morphology on reverse vertical current leakage of a GaN chip at −1000V. The blue regions indicate low leakage current (<1 uA) while the red regions indicate large leakage current (>100 uA). As can be seen from the FIGURE, region 201 of the chip has a rough surface, e.g., because of irregularities in the offcut angle in that region, and exhibits a measured leakage current of more than 100 μA. In contrast, region 201 of the chip has a relatively smooth surface, and exhibits a much smaller leakage current of less than 1 μA. See Isik C. Kizilyalli, P. Bui-Quang, D. Disney, H. Bhatia, and Ozgur Aktas, "Reliability studies of vertical GaN devices based on bulk GaN substrates," Microelectronics Reliability 55 (2015) 1654-1661. The high leakage current density is not acceptable for device yield, as there will be excessive localized heating that will produce unstable device behavior under electrical stress.

Similar results have been reported on wafers that are known to be highly non-uniform as part of ongoing evaluation efforts at the U.S. Naval Research Laboratory (NRL). Wafers that are proven to be uniformly conductive initially are predicted to exhibit improved reliability due to the mitigation of impurities that cause highly compensated insulating regions. These are a source of high non-uniform electric fields in the device that can lead to impurity diffusion and defect generation.

Thus, it is desirable to have a way to quickly and easily identify the regions of a GaN substrate that are likely to experience significant current leakage, since devices fabricated on such regions will suffer from subpar performance. Device yield will be greatly improved by mapping incoming wafers to identify the uniformly conductive regions suitable for device fabrication and appropriate lots of wafers prior to costly epitaxial growth and processing.

However, while methods for screening wafers to identify such defects or irregularities exist such as cathodoluminescence imaging or two photon photoluminescence, many of them are labor-intensive and cumbersome, while others do not examine the conductivity of the sample, which is especially critical in vertical device performance.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention uses Raman spectroscopy over the surface of a GaN substrate to produce maps of the $E_2$ and $A_1$ peaks at a plurality of areas on the substrate surface so as to identify areas of the wafer having relatively high resistivity and/or conductivity of the substrate.

The present invention also provides methods for improving the device yield of a GaN substrate by using Raman mapping to identify areas of the substrate that are more suitable or less suitable for fabrication of an electronic device thereon; methods fabricating electronic devices on a GaN substrate that includes steps of performing Raman spectroscopy over the surface of the substrate and mapping the areas of greater conductivity and/or greater resistivity; methods for fabricating electronic devices on a GaN substrate on a pre-mapper substrate; methods for identifying the size(s) of devices that can be fabricated on the substrate; and methods for fabricating the devices on specific areas of the substrate that have one or more predefined properties.

In other aspects, the present invention provides a method for evaluating a GaN substrate by performing photoluminescence imaging and mapping to identify areas of the substrate having greater conductivity and/or greater resistivity.

The evaluation methods of the present invention will enable the identification of areas in GaN substrates that are more or less suitable for the fabrication of vertical high-power (VHP) or other electronic devices before the deposition of additional semiconductor layers on the substrate so that such devices can be fabricated only (or at least primarily) on areas of the wafers suitable for the particular device, thereby improving the performance, reliability, and yield of such devices in electronics systems.

BRIEF DESCRIPTION OF THE DRAWINGS

FIGS. 1A and 1B are block schematics illustrating aspects of an exemplary ideal vertical GaN diode, in which all of the GaN layers are defect-free (FIG. 1A), and an exemplary actual vertical GaN diode, in which one or more of the GaN layers has one or more defects therein (FIG. 1B).

FIG. 5A shows the locations at which the sample exhibits $E_2$ peaks associated with lower defect presence and higher resistivity and (FIG. 5A) and locations at which the sample exhibits $A_1(LO)$ peaks associated with higher defect presence and higher conductivity (FIG. 5B).

FIG. 8A is a micrograph showing the areas on the wafer surface exhibiting peak wavenumbers associated with high defect concentrations and FIG. 8B is a plot showing a 25×25 mm $A_1(LO)$ Raman map of an inhomogeneous substrate.

FIGS. 13A-13E depict a Raman spectra (FIG. 13A) and Raman maps (FIGS. 13B-13E) used to estimate the failure rate of devices placed on a GaN sample in accordance with the present invention.

DETAILED DESCRIPTION

Figure 2:
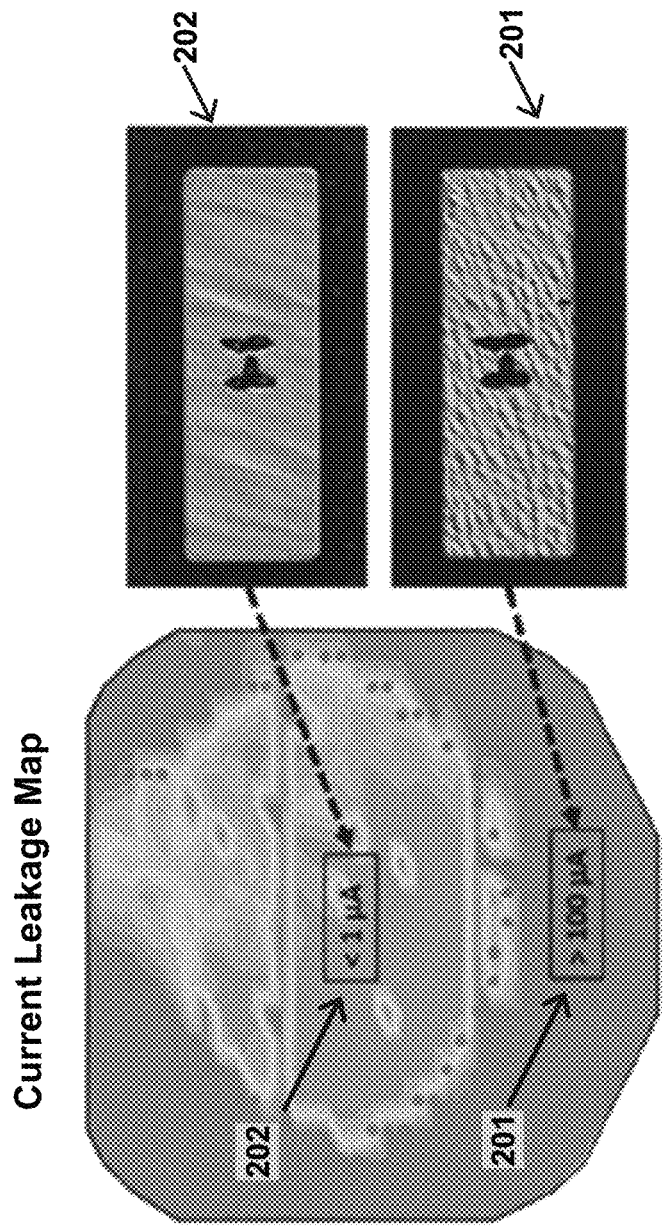
FIG. 2 is an image illustrating a map of leakage current exhibited by an area of a GaN substrate having a smooth, defect-free surface versus an area of the same substrate that has a rough surface produced by defects within the GaN crystal.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

For example, the present disclosure describes a method for using Raman spectroscopy to identify areas on the substrate that may have more than a predetermined threshold of defects or that may have a predetermined level of conductivity or resistivity suitable for a particular application. It should be noted that although the method of the present invention is described in the context of a GaN substrate and devices formed on a GaN substrate, the methods described herein may be adapted for and be equally used with other semiconductor materials and devices formed thereon, and use of the method of the present invention with other such materials and devices is deemed to be within the scope and spirit of the present disclosure.

The present invention provides methods for identifying conductive and/or resistive regions in a GaN substrate by means of Raman spectroscopy mapping.

As described in more detail below, the present invention provides methods for using Raman spectroscopy over the surface of a GaN substrate to produce a map of the E2 and A1 peaks associated with relatively high resistivity and/or conductivity of the substrate; methods for improving the device yield of a GaN substrate by using Raman mapping to identify areas of the substrate that are more suitable or less suitable for fabrication of an electronic device thereon; methods fabricating electronic devices on a GaN substrate that includes steps of performing Raman spectroscopy over the surface of the substrate and mapping the areas of greater conductivity and/or greater resistivity; methods for fabricating electronic devices on a GaN substrate on a pre-mapper substrate; methods for identifying the size(s) of devices that can be fabricated on the substrate; and methods for fabricating the devices on specific areas of the substrate that have one or more predefined properties.

The evaluation methods of the present invention will enable the identification of areas in GaN substrates that are more or less suitable for the fabrication of vertical high-power (VHP) or other electronic devices before the deposition of additional semiconductor layers on the substrate so that such devices can be fabricated only (or at least primarily) on areas of the wafers suitable for the particular device, thereby improving the performance, reliability, and yield of such devices in electronics systems.

These and other aspects of the present invention will now be described in more detail below.

Raman spectroscopy is used to measure the phonon and plasmon excitation energy of a material by measuring the wavelength shift between an incoming laser and light that is inelastically scattered off the material. Though multiple wavelengths can be used in Raman spectroscopy, in most cases light having a wavelength of 532 nm is used.

Thus, in accordance with the present invention, Raman spectroscopic analysis is performed on a predetermined plurality of locations in a predetermined area on the surface of a GaN substrate. To perform this Raman analysis, a 532 nm laser is magnified with a 10× objective on a substrate. The scattered light is separated with a diffraction grating and analyzed with a spectrometer. Filters are used to block out the elastically scattered light, which would saturate the inelastically scattered Raman signal.

GaN's wurtzite crystal structure has 8 phonon modes, but only 2, the $E_2$ mode and the $A_1(LO)$ mode, are active when the incoming light is perpendicular to GaN's c-plane. The $E_2$ peak is the dominant peak and under ideal conditions is at about 532 cm$^{-1}$; it is not affected by the electron concentration but shifts when the crystal stress changes. The $A_1(LO)$ peak is at 734 cm$^{-1}$ in undoped GaN; however, this peak is coupled to plasmon modes, causing it to shift to higher wavenumber and broaden with increased carrier concentration, and is not present when the concentration is above $10^{19}$ cm$^{-3}$. Other peaks, such as the $A_1(TO)$ peak, show up when the excitation laser is not perpendicular to GaN's c-plane, and the presence of such peaks indicates the presence of regions in the crystals having different crystallographic orientations such as those caused by polycrystalline grain boundaries.

The $E_2$ and $A_1$ peak yield different information which may be relevant to device performance and can be treated as separate metrics. The $E_2$ peak gives information about defect clusters, evidenced by a shift to larger wavenumbers, which will cause high leakage current. The $A_1$ peak gives information about carrier concentration, which will give information about electric field distribution.

Thus, in accordance with the present invention, Raman spectroscopy can be used on a GaN substrate to determine the wavenumbers at which the $E_2$, $A_1(TO)$, and $A_1(LO)$ peaks appear at each of a predetermined plurality of points on the substrate. The $E_2$ peak is around 567 cm$^{-1}$ which is always present, with variations from this wavenumber indicating changes in crystal stress which can predict crystal quality. See T. Hossain et al., "Crack Statistics and Stress Analysis of Thick GaN on Patterned Silicon Substrate," *Phys. Status Solidi B* 2018, 255, 1700399; L. T. Tung et al., "Photoluminescence and Raman studies of GaN films grown by MOCVD," *Journal of Physics: Conference Series* 187 (2009) 012021; and M. Kuball, "Raman spectroscopy of GaN, AlGaN and AlN for process and growth monitoring/control," *Surf Interface Anal.* 2001; 31: 987-999. Since current can travel through defects, defects in the substrate are associated with a relatively higher number of carriers, which can lead to relatively high current leak at the defect points. The $A_1(LO)$ peak is found at 734 cm$^{-1}$ when the carrier concentration is low (n<1017 cm$^{-3}$) and shifts to higher wavenumbers as the concentration increases. See Kuball, supra. Thus, higher wavenumbers are associated with higher carrier concentration, greater conductivity, and potentially higher current leak.

The method of the present invention uses this Raman spectroscopy to identify inhomogeneties in a GaN substrate. In the method of the present invention, the Raman spectroscopy is performed over a predefined area of the substrate. The wavenumbers at which each examined area of the substrate exhibits its E2 and A1 peaks are identified, and "maps" indicative of these wavenumbers at each area of the substrate are produced.

Thus, in accordance with the present invention, once the Raman spectroscopy is performed at the plurality of points on the substrate, data regarding the wavenumbers at which the $E_2$ and $A_1(LO)$ peaks are input into a processor programmed with appropriate software so that "Raman maps" of the substrate surface showing the $E_2$ and $A_1(LO)$ wavenumbers at each of the examined points can be produced, e.g., by fitting the peaks using a Pseudo-Voigt model known in the art or any other suitable algorithm to obtain the center wavenumber and its full width half maximum at each location on the wafer surface. The wavenumbers of the $E_2$ and $A_1(LO)$ peaks are associated with known levels of conductivity or resistivity caused by the presence of defects in the substrate. In accordance with some aspects of the present invention, the Raman maps of the substrate can by analyzed by the processor to identify the areas of the substrate that meet a predetermined threshold of defects, conductivity, or resistivity that make them suitable for the fabrication of a particular electronic device can be quickly and easily identified.

Figure 3:
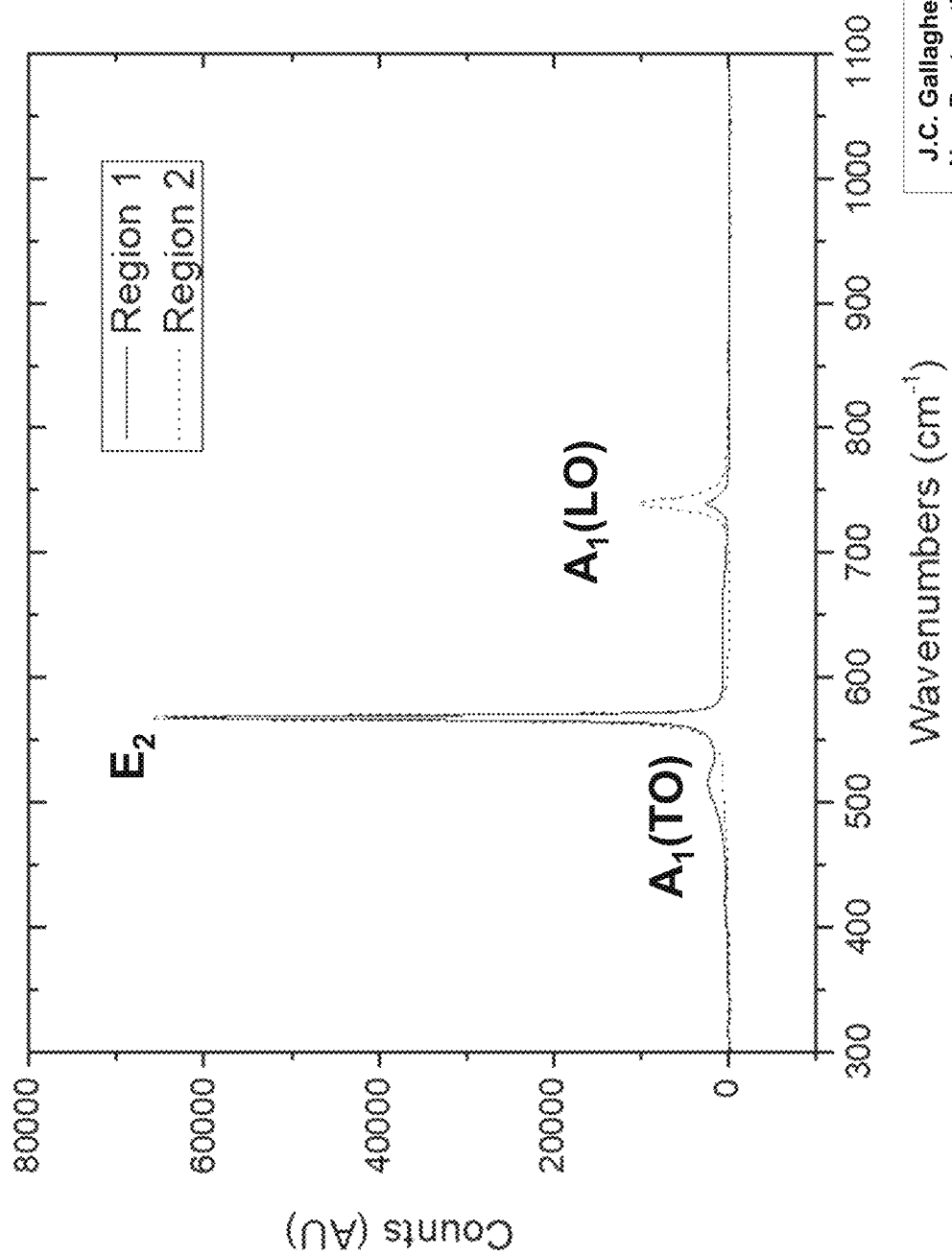
FIG. 3 is a plot showing the results of Raman spectroscopy performed on three different regions of a GaN surface, showing the wavenumbers at which the substrate's $E_2$, $A_1(TO)$, and $A_1(LO)$ peaks appear in each region.

The plot in FIG. 3 illustrates a typical Raman spectra of a non-uniform sample in three different regions of a GaN substrate. The plot in FIG. 3 shows the $E_2$, $A_1(TO)$ peak, and $A_1(LO)$ peaks in each Region. As can be seen from the plot, all of Regions 1, 2, and 3 exhibit an $E_2$ peak at a wavenumber of about 560 cm$^{-1}$ and an $A_1(LO)$ peak at a wavenumber of about 750 cm$^{-1}$. The $A_1(TO)$ peak at about 500 cm$^{-1}$ suggests the presence of polycrystalline grain boundaries in the sample, which can also affect the suitability of the sample for use in device fabrication.

Figure 4A:
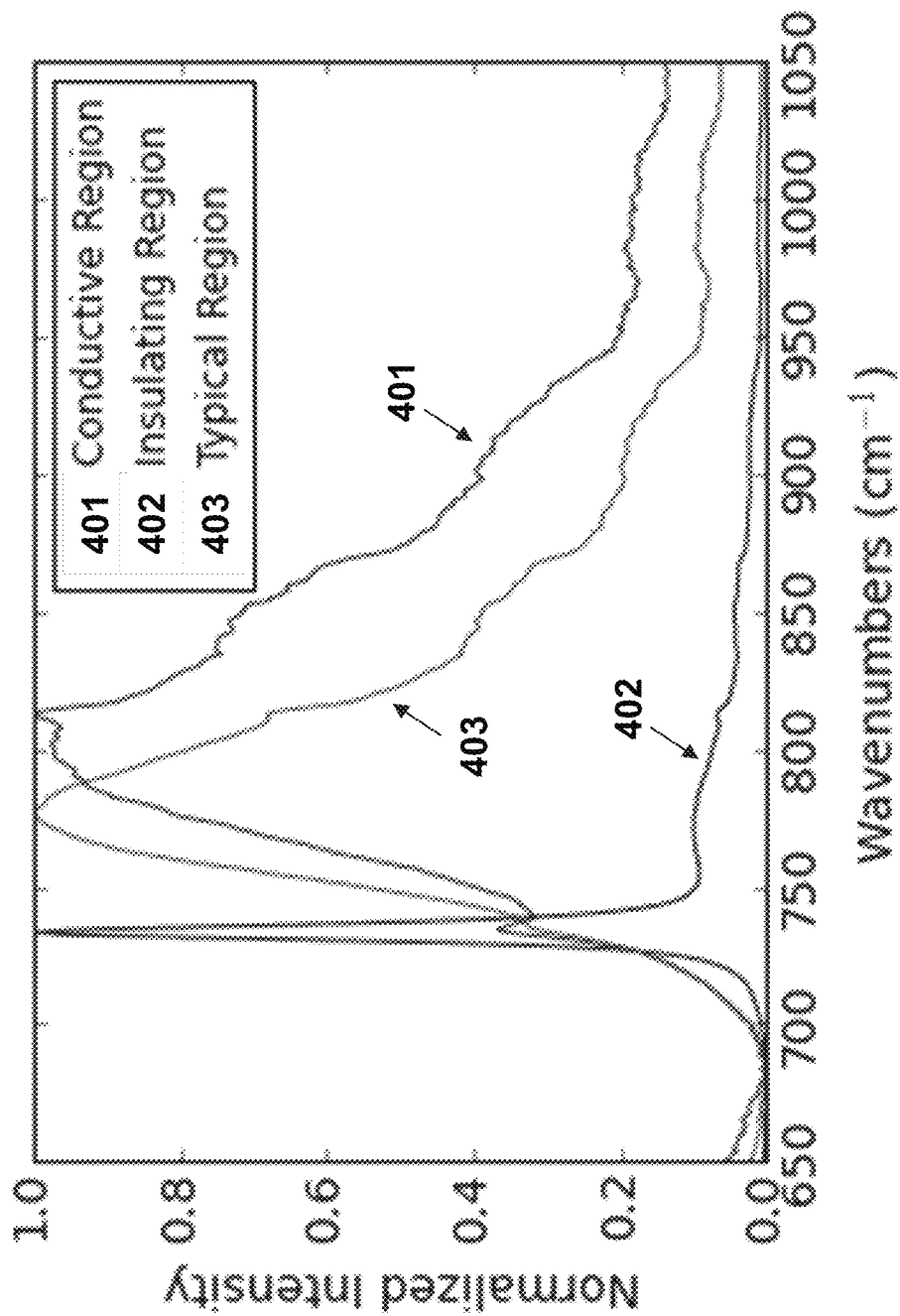
FIGS. 4A and 4B are plots showing the results of Raman spectroscopy performed on a conductive region, an insulating region, and a neutral region of a GaN surface, showing the wavenumbers associated each region.

The plot in FIG. 4A illustrates the effect of carrier concentration on the $A_1(LO)$ peak wavenumber. The $A_1(LO)$ peak wavenumber at a given location on the GaN wafer can be used to calculate the carrier concentration at that location using analytical and numeric methods known in the art, such as those described in Kuball, supra.

In these methods, the peak wavenumber associated with the $A_1(LO)$ peak can be determined at each of a plurality of predetermined locations on the surface of an n-type GaN wafer. This wavenumber can then be used to find the electron carrier concentration n by solving for the plasmon frequency in the equation $$\varepsilon(\omega) = \varepsilon_\infty \left[ 1 + \frac{\omega_L^2 - \omega_T^2}{\omega_T^2 - \omega^2 - iw\Gamma} - \frac{\omega_P^2}{\omega(\omega + i\gamma)} \right],$$

where $\omega_L$ and $\omega_T$ are the frequencies of the $A_1(LO)$ and $A_1(TO)$ phonons with zero photon plasmon coupling (735 and 533 cm$^{-1}$, respectively), $\Gamma$ and $\gamma$ are damping parameters (assumed to be negligible), $\varepsilon_\infty = 5.35$ is the optical dielectric function of GaN, and $$\omega_P^2 = \frac{4\pi n e^2}{\varepsilon_\infty m^*},$$

where n is the electron carrier concentration, e is the charge of an electron and m* is 1/8$^{th}$ the mass of an electron. Solving the equation for $\varepsilon(\omega)=0$ with $\omega$ being the measured frequency of the $A_1(LO)$ peak, the carrier concentration n at any given location on the wafer can be obtained.

Figure 4B:
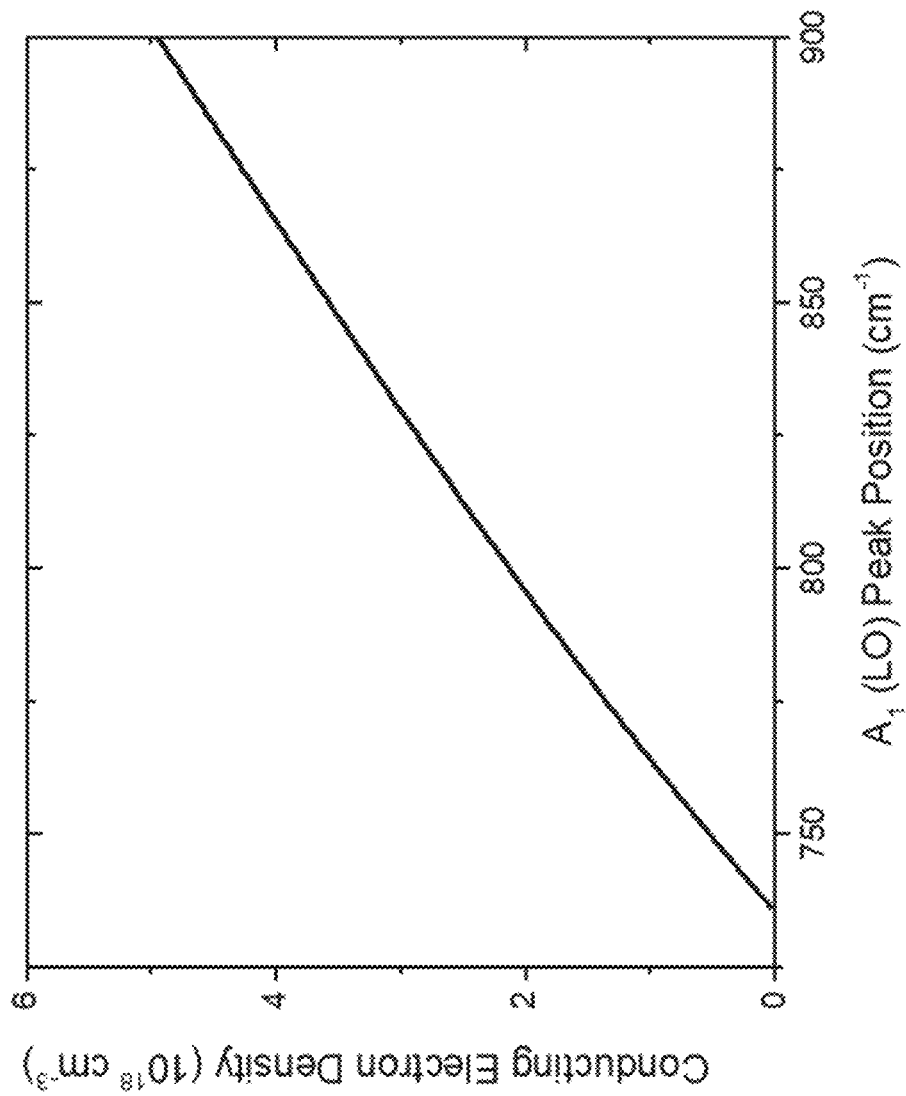

FIG. 4B shows the graph of n (conductive electron density) vs. wavenumber of the $A_1(LO)$ peak. Note that if the Raman spectra samples multiple regions of the wafer having different carrier concentrations, multiple $A_1(LO)$ peaks may be present. As an example, curve 401 in FIG. 4B has a small peak around 735 cm$^{-1}$ with a dominant peak centered around 825 cm$^{-1}$. Curve 402 has a dominant peak around 735 cm$^{-1}$ and a small shoulder peak at 775 cm$^{-1}$. For most of the plots in this paper, the dominant of the two peaks is shown unless otherwise specified.

In accordance with other aspects of the present invention, the wavenumbers of the $E_2$ and $A_1(LO)$ peaks at a predetermined plurality of locations on the substrate map can be analyzed by the processor, and using this analysis, the substrate can be classified as being a "Type I" wafer, in which few if any defects are present and the carrier distribution is homogeneous, or a "Type II" wafer which contains defects which increase the number of carriers at the defect site. Type II wafers can be further classified as "Type II-a," in which defects, and thus the spike in carrier presence, are present in a regular pattern, or as "Type II-b," in which defects and carriers are present in a more random pattern.

Though Type I wafers have more consistent sample quality and device performance, they are more expensive than Type II wafers, therefore there is much motivation in mapping Type II wafers to determine which regions in these wafers will produce higher quality device performance. Additionally, Type I wafers can have defects in localized regions, making it important to screen these wafers as well.

Figure 5B:
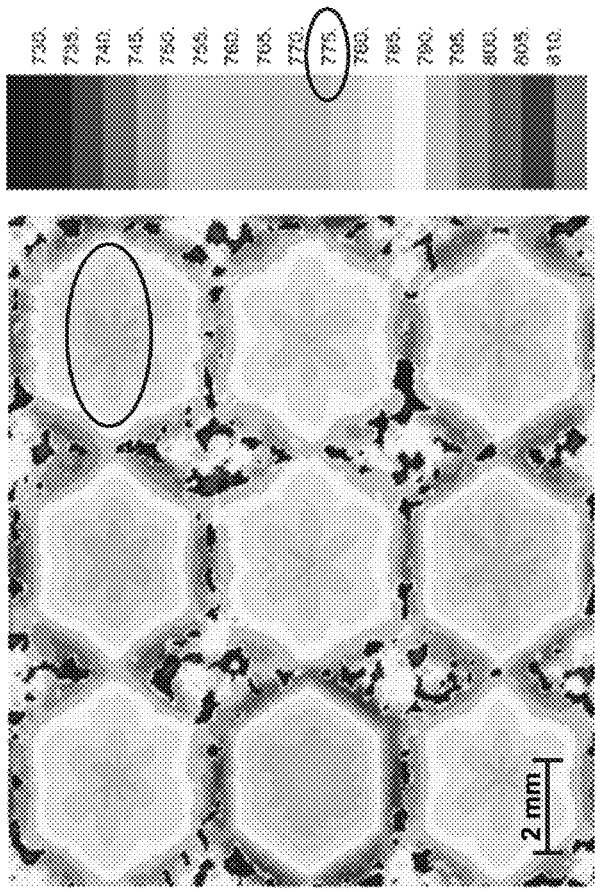
FIGS. 5A and 5B depict maps of the surface of a GaN sample showing the results of Raman spectroscopy performed in accordance with the present invention, where
Figure 5A:
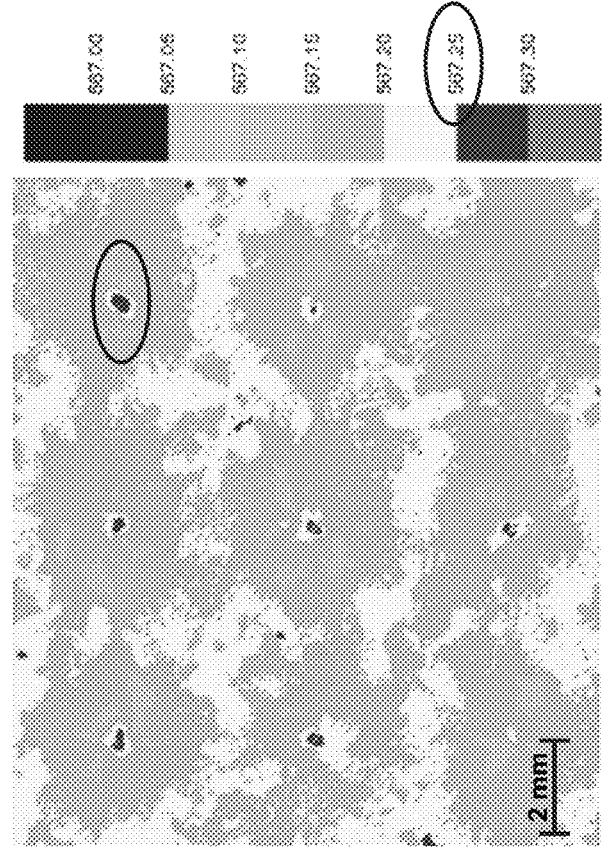

FIGS. 5A and 5B depict exemplary Raman maps that can be generated by the Raman spectroscopy investigation method in accordance with the present invention.

FIG. 5A depicts an exemplary map that can be generated in accordance with the present invention. In the map shown in FIG. 5A, the wavenumbers for the Raman $E_2$ peaks at each of a plurality of points on the GaN surface are shown by means of the color intensity legend accompanying the map. As described above, the wavenumbers of the $E_2$ peak are correlated with the density of defects in the substrate, with the $E_2$ peak at wavenumber 567 is associated with a higher defect density than is present where the $E_2$ peaks are at other wavenumbers. The defect density associated with particular wavenumbers is known. See Kuball, supra. Thus, using the mapping method in accordance with the present invention, the defect density at a given location on the substrate can be readily identified by examining the wavenumbers of the $E_2$ peak at that location. In this way, areas of the wafer having a wavenumber correlated with a particular defect density can be readily identified so that areas of the substrate having a defect density higher than a predetermined threshold level, making them unsuitable for, e.g., vertical device fabrication, can be avoided when determining where on the substrate devices are to be manufactured.

It is also known that areas with higher defect densities often are more conductive than those with fewer defects. See, e.g., Michael A. Reshchikov and Hadis Morkoç, "Luminescence properties of defects in GaN," J. Appl. Phys 97, 061301 (2005). Thus, in accordance with the present invention, a map of the wavenumbers revealed by Raman spectroscopy of a GaN sample can also reveal the wavenumber at which an area of the GaN sample exhibits its $A_1$ peaks, with higher wavenumbers being associated with higher defect density and greater conductivity.

In addition, as with the $E_2$ wavenumber map described above with respect to FIG. 5A, a map such as that depicted in FIG. 5B, showing the wavenumbers for the $A_1$ peaks at multiple locations on the surface of the GaN sample, can be produced by a processor programmed with appropriate software, with the wavenumbers being shown by a color intensity scale accompanying the map. By analyzing the wavenumbers of the $A_1$ peaks as shown on the map, areas of the GaN substrate that are more or less conductive can be readily identified, with devices being fabricated on areas of the substrate meeting a predetermined, desired conductivity threshold or having a predetermined specific conductivity level and not being fabricated on other areas of the substrate. By allowing optimization of device size and packing, device yield on a wafer can be improved.

The wafer illustrated in FIG. 5B is a Type II-a wafer, in which carrier concentrations exist in a regular pattern of regions having similar carrier concentrations. Analysis of the $E_2$ peak of this wafer shows that at the center of each region there is a shift in peak position indicating large crystal stress. This shift is only about 0.1 cm$^{-1}$, indicating that it is difficult to detect by $E_2$ peak analysis. The crystal stress is likely the results of higher dislocation density, causing the larger carrier concentration detected using the $A_1$ peak. The high carrier concentration features are often referred to as "high n" regions, while the spaces between them are referred to as being "low n." Since high carrier concentration is often correlated with high current loss, in many cases, electronic devices would best be manufactured outside these regions to ensure their high quality.

The Raman technique is well complimented by photoluminescence spectroscopy and photoluminescence imaging. PL excitation using a 325 nm laser has been shown to detect shallow donors (such as Si or O), electron traps (such as Zn, Mg, and C), and defect complexes. This technique, like Raman, can too be used to map the densities of these defects over long ranges. Micro PL mapping and Raman mapping requires large amounts of data to analysis. The analysis can be made simpler by taking photoluminescence images with different excitation wavelengths.

Figures 6A, 6B:
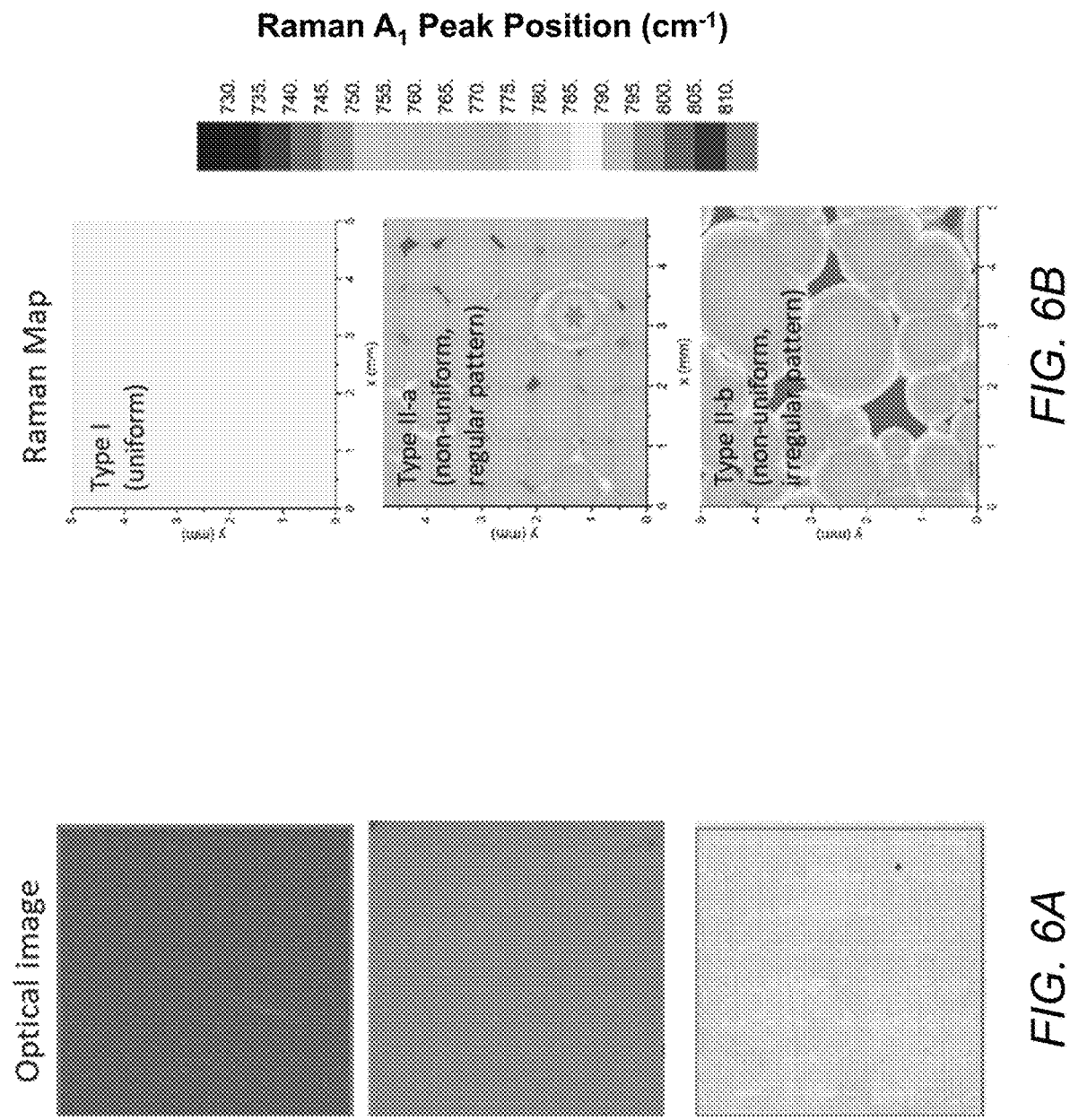
FIGS. 6A and 6B depict optical images (FIG. 6A) and corresponding Raman maps (FIG. 6B) of uniform, regular non-uniform, and irregular non-uniform GaN samples, showing areas in the sample having higher and lower concentrations of defects and having relatively higher or lower conductivity.

FIGS. 6A and 6B depict optical images (FIG. 6A) and corresponding Raman maps (FIG. 6B) of uniform, regular non-uniform, and irregular non-uniform GaN samples. In the optical images shown in FIG. 6A, all of the samples appear smooth and do not exhibit any obvious features, making it difficult if not impossible to identify areas on the substrate that may be unsuitable for vertical device growth or to identify areas on the substrate where devices of a certain size may be fabricated while devices of other sizes may not. In contrast, analysis of the Raman maps shown in FIG. 6B can readily determine whether the substrate is one of the Type I, Type II-a, or Type II-b substrates described above, i.e., is uniform, with no defects (Type I); non-uniform, with defects in a regular pattern (Type II-a); or non-uniform, with defects in an irregular pattern (Type II-b).

Characterizing the wafers in this way can facilitate device fabrication to maximize use of the wafer characteristics and/or avoid use of unsuitable wafers. Type I wafers have a consistent device performance across the sample and so can be readily used for device fabrication. While the inhomogeneities present in Type II wafers can hurt device performance, the devices can be fabricated on the wafer so as to be aligned to the pattern, thereby minimizing the effect of the wafer inhomogeneities on the device. The performance of devices fabricated on Type II-b wafers is difficult to predict, and such wafers are therefore deemed to be unsuitable for vertical device fabrication.

Figure 7B:
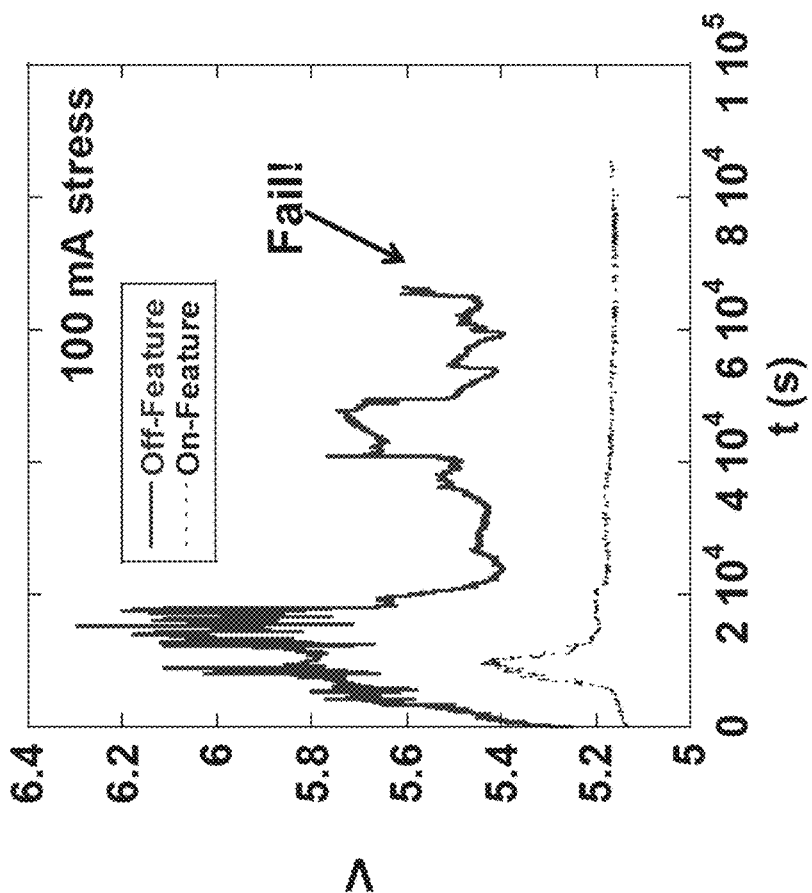
FIGS. 7A and 7B illustrate the results of Raman mapping of a GaN wafer in accordance with the present invention, where
Figure 7A:
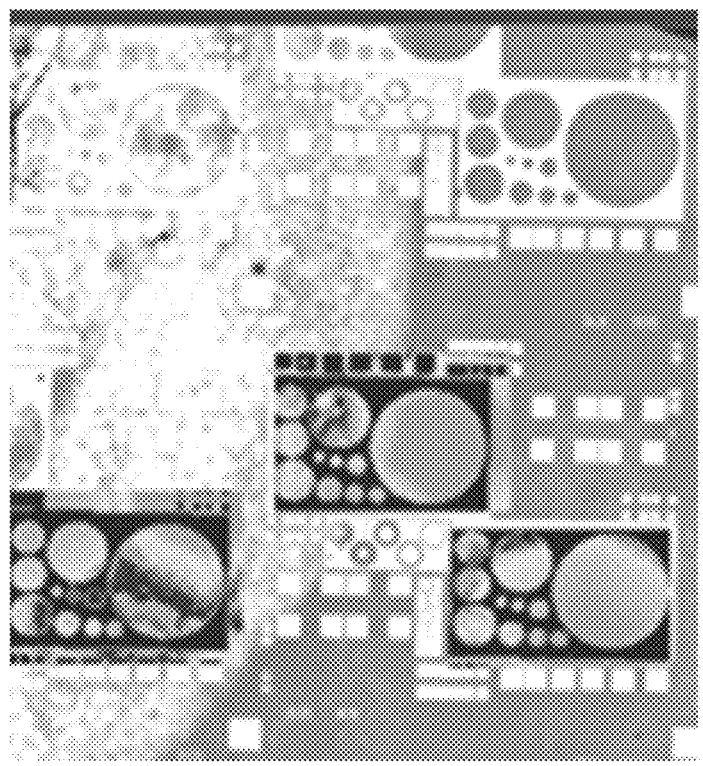

FIGS. 7A and 7B further illustrate the analytical results that can be obtained from the method for mapping a GaN substrate in accordance with the present invention. FIG. 7A is a micrograph showing the areas on the wafer surface exhibiting peak wavenumbers associated with high defect concentrations. This illustrates the devices shown on the wafer have different carrier concentration. FIG. 7B shows the long-term electrical stress test of devices on and off the features (circled regions in FIGS. 5A and 5B) by applying a constant 100 mA current. The samples off the feature have a smaller consistent voltage drop across the sample suggesting the devices have lower on resistance and are more robust. On the feature there is a larger variation in voltage and the device fails (e.g., develops a short circuit) after about 17 hours.

Figure 8:
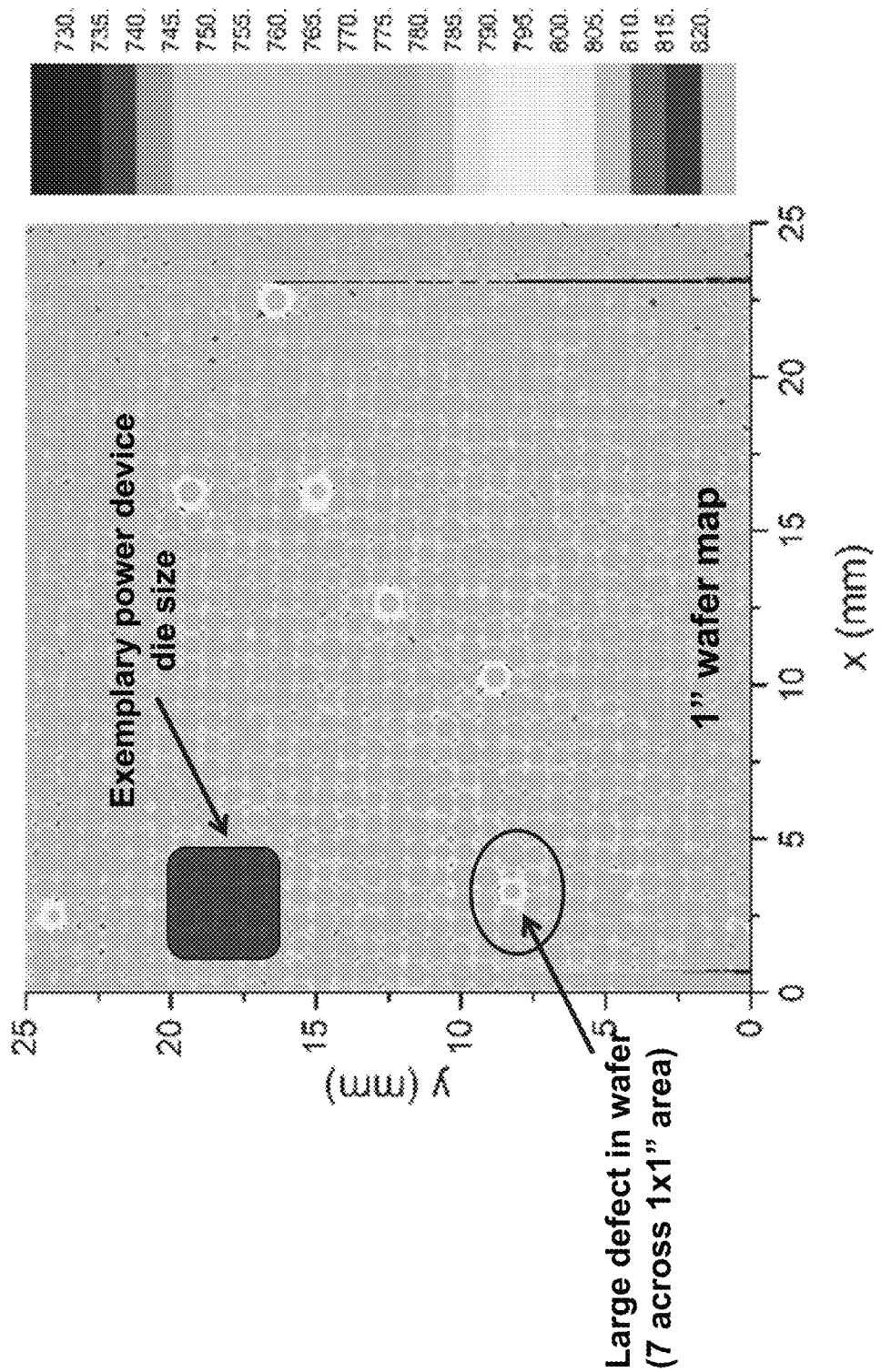
FIG. 8 is an exemplary Raman map produced in accordance with the present invention, showing specific areas on the GaN surface exhibiting peak wavenumbers associated with high defect concentrations, as compared to the size of an exemplary electronic power device that might be fabricated on the surface of the GaN wafer.

FIG. 8 is a 25×25 mm portion of a Raman map such as that illustrated in FIG. 7A, and shows showing specific areas on the GaN surface exhibiting peak wavenumbers associated with high defect concentrations, as compared to the size of an exemplary electronic power device that might be fabricated on the surface of the GaN wafer.

Practical GaN devices will clearly overlap with regions of large defects. Though not visible in optical microscopy, these devices will exhibit large leakage current and premature failure. Avoiding these areas or altering device size or aspect ratios to maximize area is critical to a high yield process. Thus, in accordance with the present invention, as described above, Raman maps of the GaN surface can be prepared and the defect concentrations at a plurality of points of the surface can be identified through analysis of the $A_1(LO)$ peak wavenumbers exhibited at those points. Such defect concentrations can then be compared to a predetermined threshold defect concentration that makes a substrate suitable (or unsuitable) for use in high-quality device fabrication, and the devices can be fabricated on only suitable areas of the substrate, or if necessary, the substrate can be discarded in its entirety before low-quality devices are unnecessarily fabricated thereon. In other cases, this analysis can be used to determine the size of the device that can be fabricated on certain areas of the substrate, with the size of the device being tuned to avoid areas having defect concentrations above a predetermined threshold.

Figure 9B:
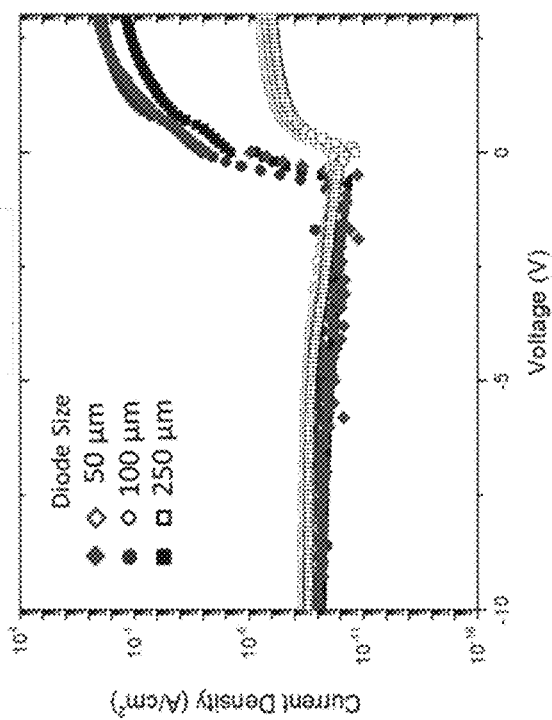
FIGS. 9A-9B illustrate aspects of use of the Raman mapping method for evaluating GaN wafers in accordance with the present invention to identify relatively resistive and conductive areas on the surface of a uniform GaN substrate.
Figure 9A:
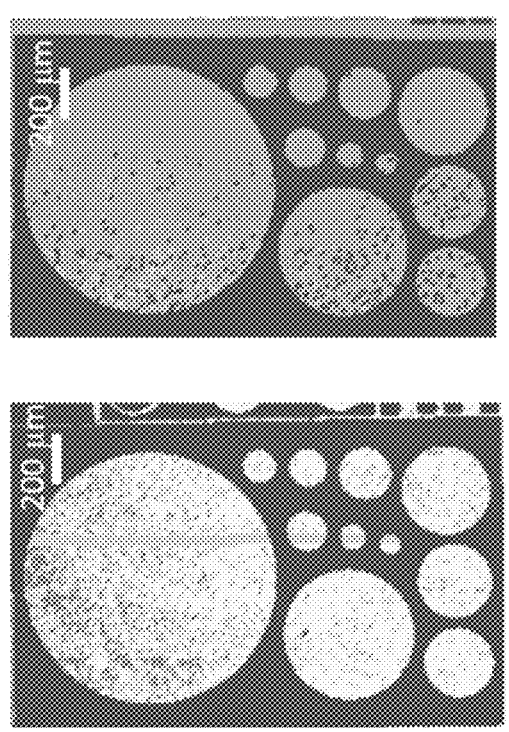

FIGS. 9A-9B illustrate aspects of use of the Raman mapping method for evaluating GaN wafers in accordance with the present invention to classify the substrate as uniform (Type I) or nonuniform (Type II) and to identify relatively resistive and conductive areas on the surface of a uniform GaN substrate.

FIG. 9A shows Raman Maps of two uniform Type I samples. Although the plot in FIG. 9B shows different current-voltage curves taken from devices of varying diameter, the plot also shows that the curves all overlap when normalized to area, and thus devices fabricated on such uniform wafers on in regions of wafers identified to have uniform spectroscopic properties can be expected to exhibit uniform device performance. Similarly, although groups of devices from different wafers exhibit different electrical properties depending on the epitaxial structure (closed symbols vs open symbols), devices within a single uniform sample are nominally similar.

Figure 10B:
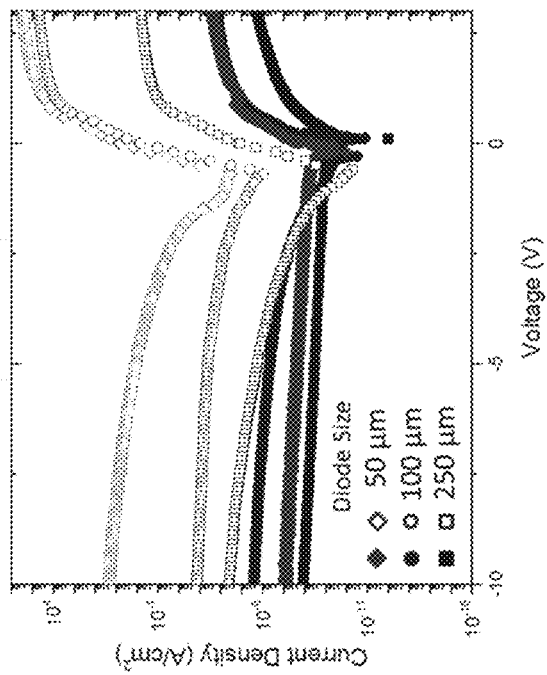
FIGS. 10A-10B illustrate aspects of use of the Raman mapping method for evaluating GaN wafers in accordance with the present invention to identify relatively resistive and conductive areas on the surface of a non-uniform GaN substrate.
Figure 10A:
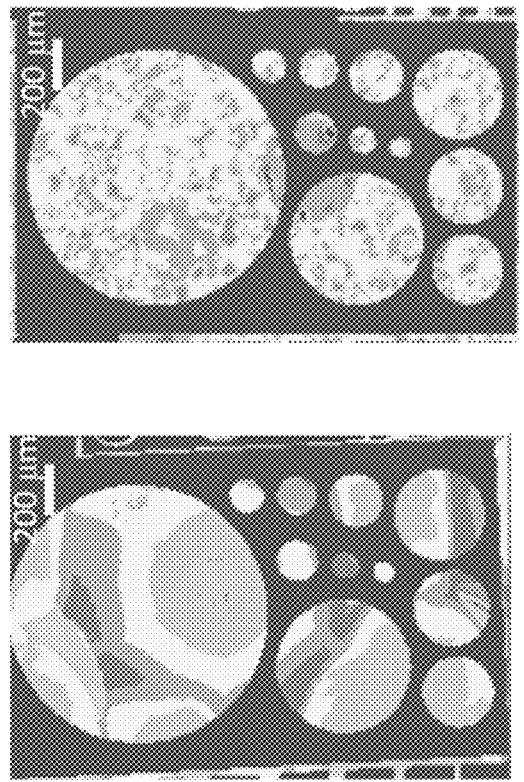

Similarly, FIGS. 10A-10B illustrate aspects of use of the Raman mapping method for evaluating GaN wafers in accordance with the present invention to identify relatively resistive and conductive areas on the surface of a non-uniform GaN substrate.

FIG. 10A shows Raman Maps of two non-uniform Type II samples. As can be seen from the plot in FIG. 10B, devices fabricated on non-uniform wafers on in regions of wafers identified to have non-uniform spectroscopic properties also exhibit non-uniform device performance. In contrast to the current-voltage curves for devices fabricated on a uniform surface, the current-voltage curves taken from devices of varying diameter fabricated on a non-uniform surface do not overlap when normalized to area. Although there is a similar spread in all samples, groups of devices from the two different wafers exhibit different electrical properties depending on the epitaxial structure of each wafer.

Figure 11A:
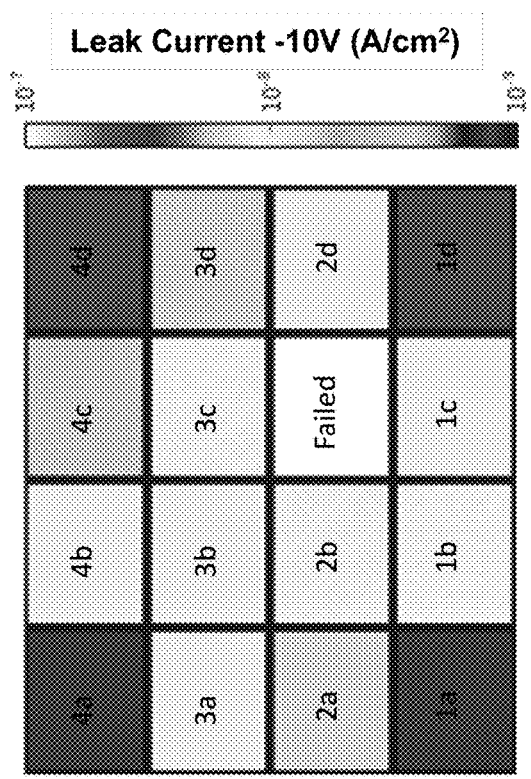
FIGS. 11A and 11B illustrate aspects of exemplary maps showing the leakage current in identified areas of a GaN wafer.
Figure 11B:
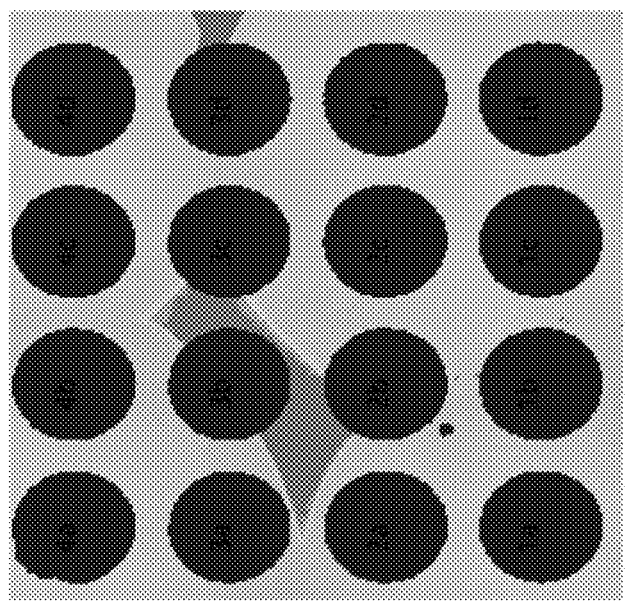

FIGS. 11A and 11B demonstrate the way in which Raman mapping and analysis of a GaN wafer in accordance with the present invention can be used to improve fabrication of high-quality vertical devices by identifying areas of the substrate that are suitable or unsuitable for device or by assisting in determining the size(s) of devices that can be fabricated on a substrate and/or determining their optimum placement on the wafer surface.

The block schematic in FIG. 11A shows a 4×4 grid corresponding to areas of a Type II wafer which has been analyzed using Raman mapping in accordance with the present invention, where areas of the wafer surface are categorized according to their leakage current at −10V. Analyzing photoluminescence images and the $E_2$ peak shift from the type of wafer reviews reveals this wafer to be high quality when the carrier concentration is low.

The schematic in FIG. 11B shows a map of the same substrate, on which a 4×4 grid of PIN devices have been fabricated. The corner devices 1a, 1d, 4a, and 4d have been fabricated close to the corresponding regions of high current leakage shown in FIG. 11A, while the other devices in FIG. 11B are fabricated on areas of the surface exhibiting lower current leakage (the grid entry "fail" in FIG. 11B refers to an area of the wafer in which insufficient information was obtained for it to be categorized). This indicates that wafer yield can be improved by changing the alignment of the devices to avoid unsuitable areas of the wafer.

Figure 12B:
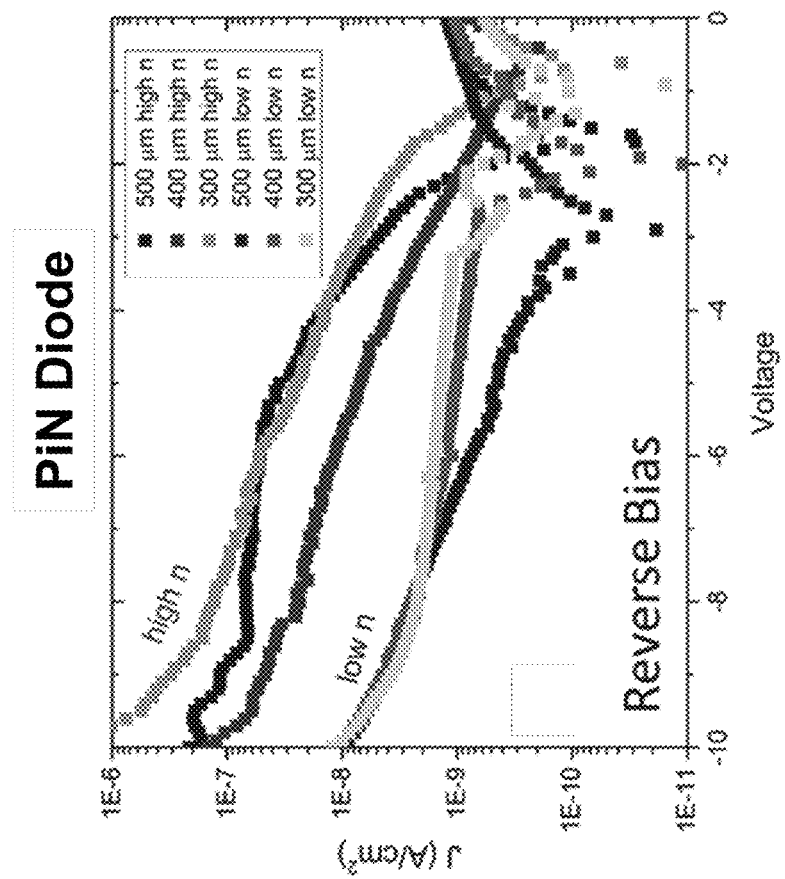
FIGS. 12A and 12B are plots illustrating the forward and reverse bias of the wafers in regions with low carrier concentration (low n) and high (high n) carrier concentration.
Figure 12A:
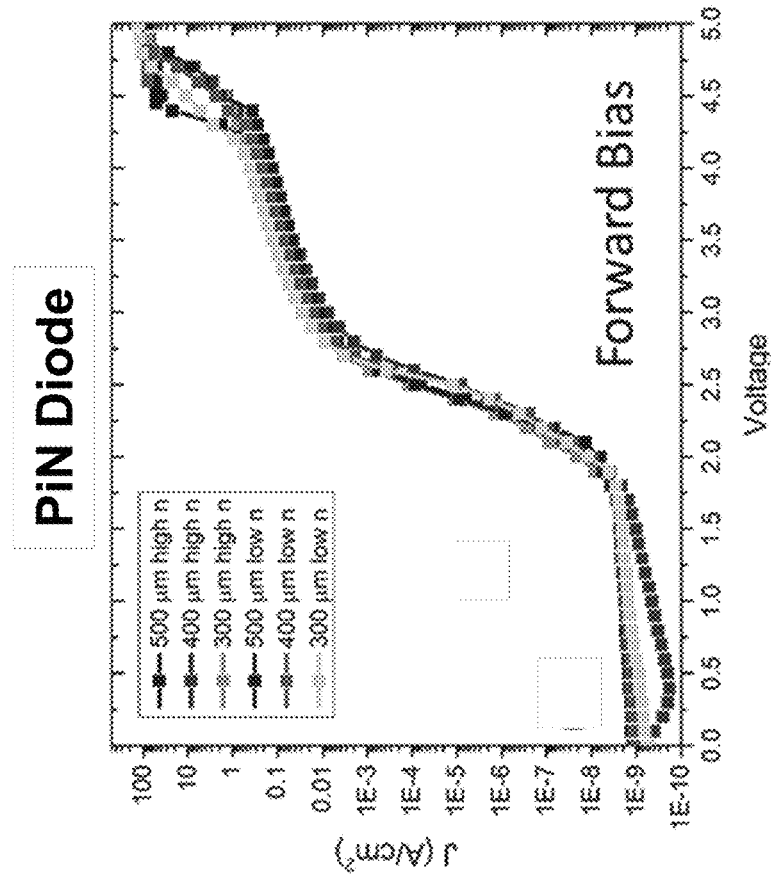

The plots in FIGS. 12A and 12B illustrate the forward (FIG. 12A) and reverse (FIG. 12B) bias of PIN devices in the regions of high and low carrier concentration (n) of varying diameters. The regions are identified using the same Raman technique on wafer similar to the one shown in FIG. 11B. This shows an increased leakage current density in all devices with larger carrier concentration. This indicates that the Raman method for identifying optimal and non-optimal regions on the Type II wafers is consistent, and works with devices of varying diameters.

Using the above information, a computer algorithm can be used to estimate the percentage of devices with the lower leakage current. First a Raman map needs to be taken, and the two $A_1$ peaks and the $E_2$ peak need to be fitted to a predetermined acceptable peak value. If the $A_1(TO)$ peak is present, the region is not suitable due to polycrystalline grain boundaries being present. Changes in the $E_2$ peaks position or indicate regions of high crystal stress. A cutoff value of the leakage current can be established though outlier detection statistical algorithms known in the art. Any device above/below that predetermined cutoff value will likely be lower quality, and so areas of the wafer (or entire wafers as the case may be) that would produce such devices can be avoided.

This aspect of the present invention is further illustrated by the maps and plot in FIGS. 13A-13E.

The plot in FIG. 13A shows a spectrum of an $A_1$ peak with both conductive and insulating components. In the case the $A_1(LO)$ peak can be presented as the height ratio between the $A_1(LO)$ conductive peak ($H_{CON}$) and insulating peak ($H_{INS}$). A failure threshold can be established by correlating the $E_2$ cutoff point to the $A_1(LO)$ doublepeak height ratio (calculated to be 1.5 in this case).

FIG. 13B shows a Raman map of the $E_2$ peak position on a Type II GaN wafer. On most regions of the sample, the peak is positioned between 566.45 and 566.55 cm$^{-1}$. However, a regular pattern of patches is shown to have the peak below 566.4 cm$^{-1}$, most likely caused by change in crystal stress. The map can be binned into 200-micron-sized areas, as shown in FIG. 13D, and the $E_2$ stress factor, defined as the percentage of the device on an area below a predetermined cutoff, can be calculated so that "good" areas of the sample can be identified. Samples with zero stress should good devices, though devices with a stress factor below some predetermined level may also be acceptable for some applications.

A similar method can be done on the FWHM of the $E_2$ peak. Since changes in the $E_2$ peak are typically small, it can be hard to use it as a definitive method. An example of this is the Red stripe at the bottom of FIG. 13B, which yields some false positives. However, the effects of the $E_2$ peak shift can be correlated to observations in the $A_1$ peak or a photoluminescence image, which show up more profoundly.

FIG. 13C shows the map of the peak ratio over a sample. From this, we can see that a red stripe in the $E_2$ map of FIG. 13B deconvolutes into several features leading to more bad spots for fabricating devices.

Figure 13E:
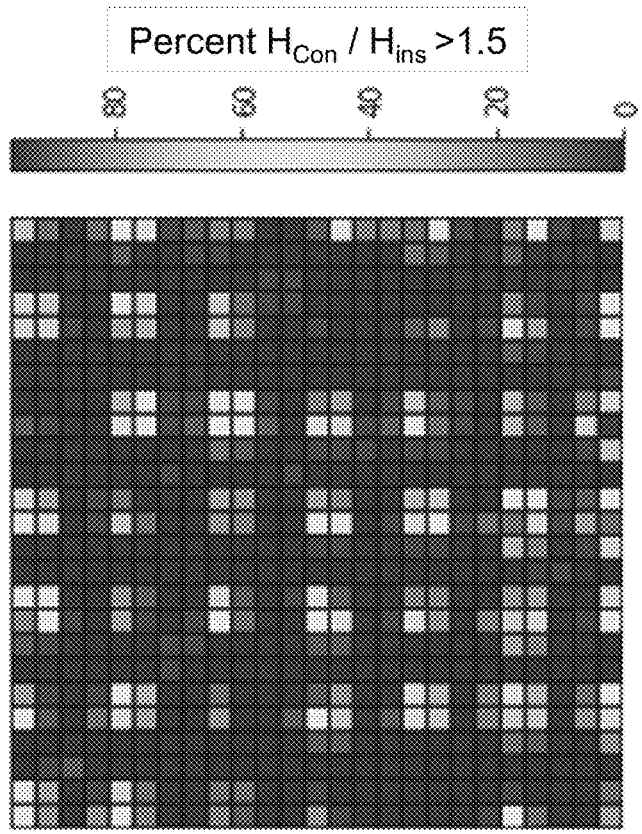
Figure 13D:
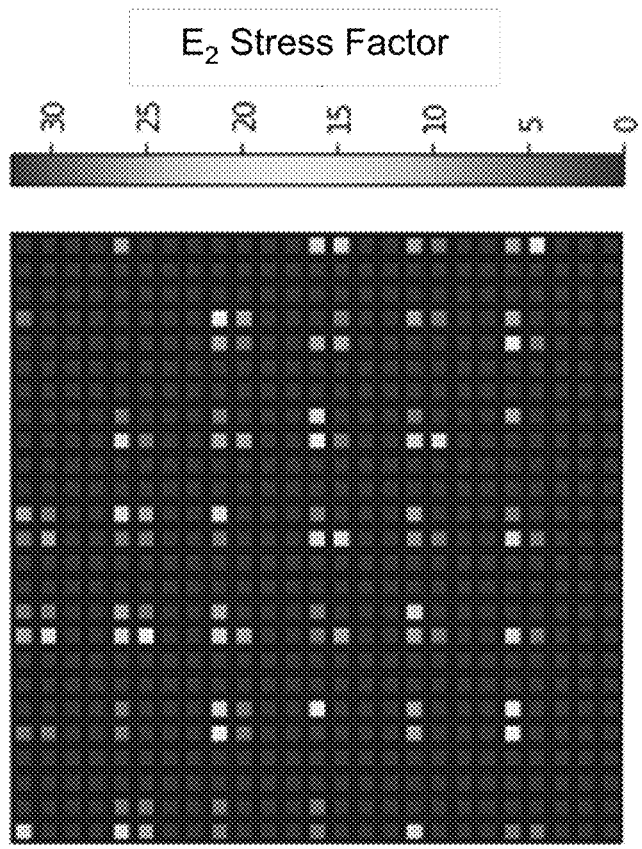

FIG. 13E shows a map with the same size bins as FIG. 13D. It has a success rate of 60% instead of 85% due to fewer false positives. The cutoff ratio for the $A_1(LO)$ peak can also be established by comparing the spectra to defects in the photoluminescence images and spectra and increase in the FWHM of the $E_2$ peak. A combination of the comparison methods can also be used to make a more complex condition if multiple types of defects are present.

Figure 14:
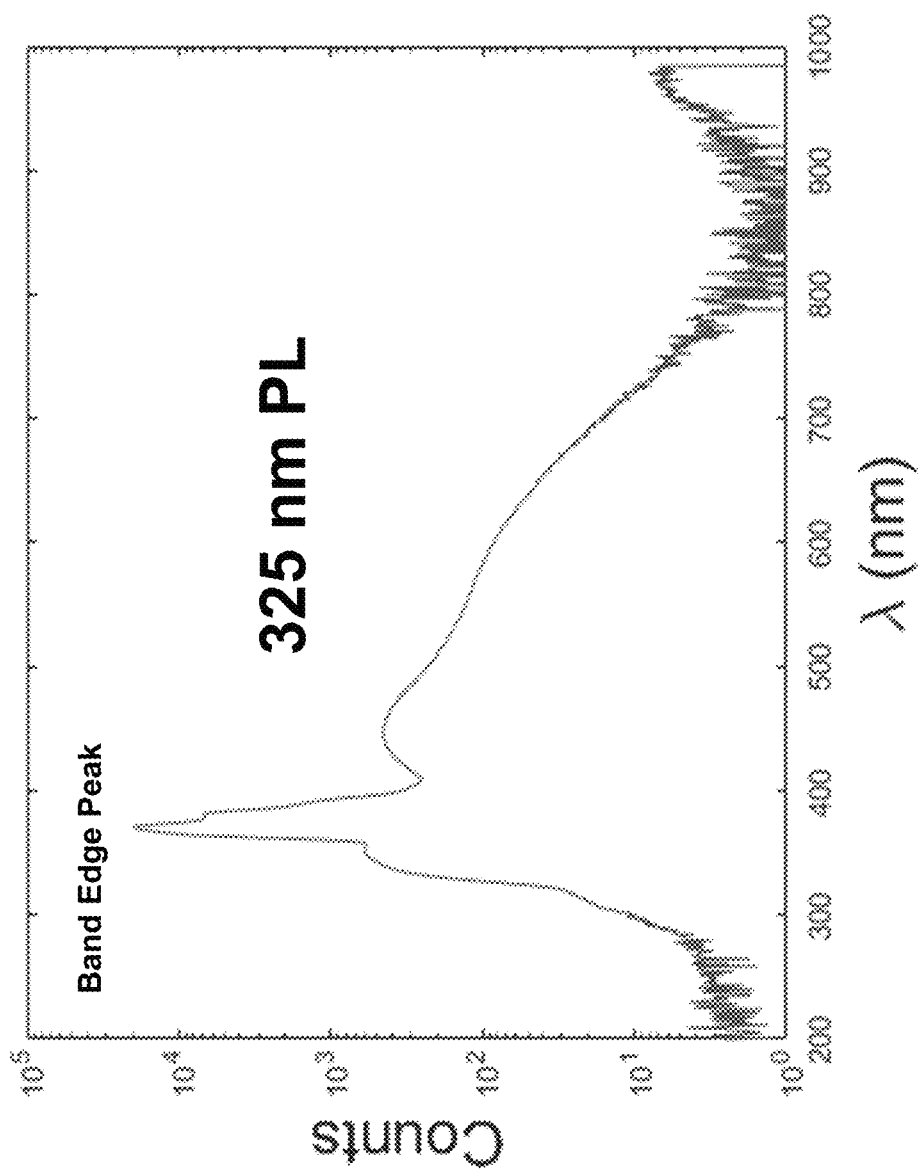
FIG. 14 of an exemplary photoluminescence (PL) spectrum, showing a band edge peak at 3.4 eV (365 nm), a donor acceptor peak around 400 nm, and a yellow band peak at around 500 nm.

Photoluminescence is a useful technique for identifying defects in GaN. This technique using a high energy, above-bandgap (usually 325 nm) laser to excite electrons to the conduction band. The electrons relax into either the valence band or an energy state caused by defects producing a luminescence that can be analyzed with a spectrometer. A typical PL spectrum is shown in FIG. 14. Though many peaks exist, three major ones observed in many spectra are the band edge peak at 3.4 eV (365 nm), a donor acceptor peak around 400 nm, which indicates a p-type dopant is present, and a yellow band peak that is broad and covers most of the visible spectrum but peaks around 500 nm.

Although PL mapping of a GaN wafer, analogous to the Raman mapping described herein, can be performed and is useful in determining the uniformity of GaN, a much quicker way to measure the wafer's uniformity is to take a PL image. To form a PL image, the sample is illuminated with a large area monochromatic light having an energy (wavelength) near the sample's bandgap. This light is reflected from the sample, and the resulting luminescence is captured with a microscope camera. The optics of a standard visible light microscope typically filter out the band edge luminescence, though the wavelength can also be tuned to only excite sub-bandgap peaks, or optical filters such as band-pass, long-pass, or short-pass can be inserted in the optical path to image in at selected wavelengths. The technique can also be applied utilizing a laser source with appropriate lenses for beam expansion. This PL imaging process takes a few seconds as opposed to the few hours it takes to use Raman or Photoluminescence spectroscopy mapping.

Figure 15A:
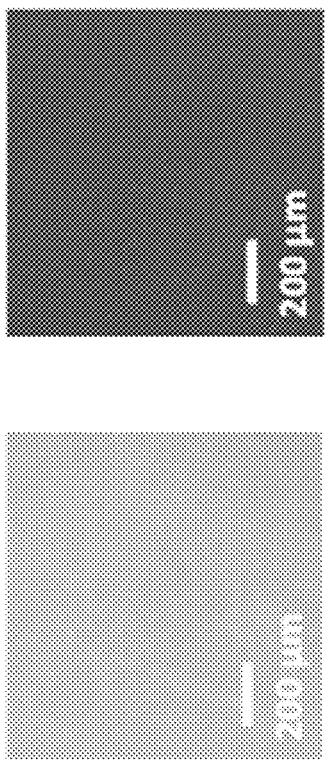
FIGS. 15A and 15B are PL images of Type I (FIG. 15A) and Type II (FIG. 15B) GaN substrates that can be used to evaluate the substrates in accordance with one or more aspects of the present invention.
Figure 15B:
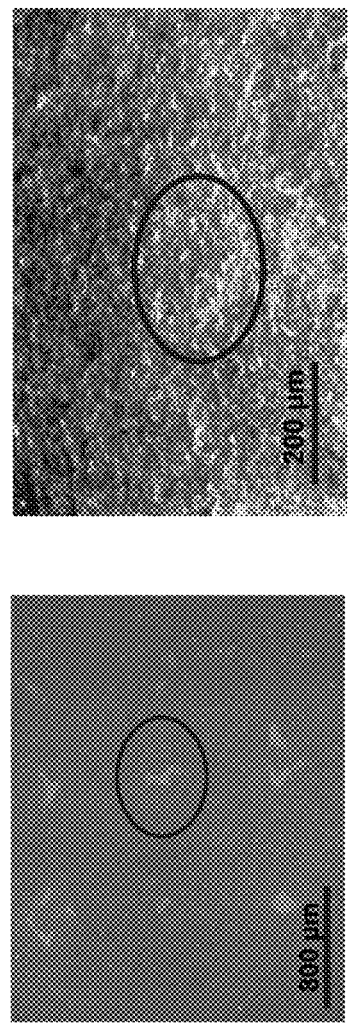

FIGS. 15A and 15B depict exemplary PL images of Type I and Type II wafers, respectively. It is rare for GaN wafers to have no defect peaks and most wafers exhibit green luminescence. However, in Type II wafers, these defects can change the intensity of the band edge peak, and deviations in the PL luminescence can be detected, often manifesting as spots in the image (circled in FIGS. 15A and 15B) resulting from a shifting of the yellow band peak to longer wavelengths.

Photoluminescence mapping and imaging are techniques that can be used in parallel with or as an alternative to the Raman spectroscopy technique described above. While PL analysis is more difficult to interpret due to many properties changing morphology of the spectrum, it has the advantages of being visible optically due to the direct bandgap nature of III-N materials, though a more detailed analysis is needed to determine what these defects are an what is causing them.

Figure 16B:
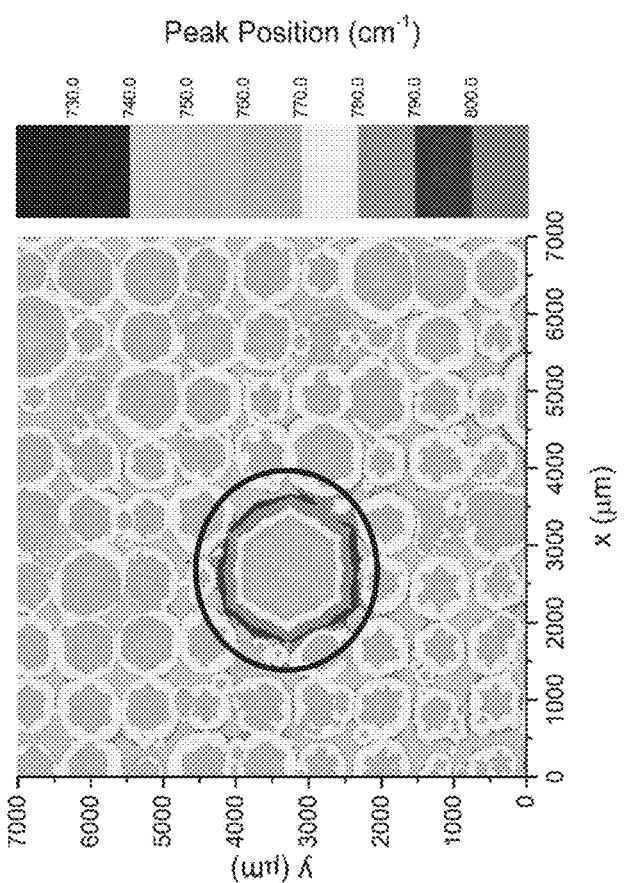
FIGS. 16A and 16B are PL (FIG. 16A) and Raman (FIG. 16B) maps of a Type II GaN substrate that can be used to evaluate the substrates in accordance with one or more aspects of the present invention.
Figure 16A:
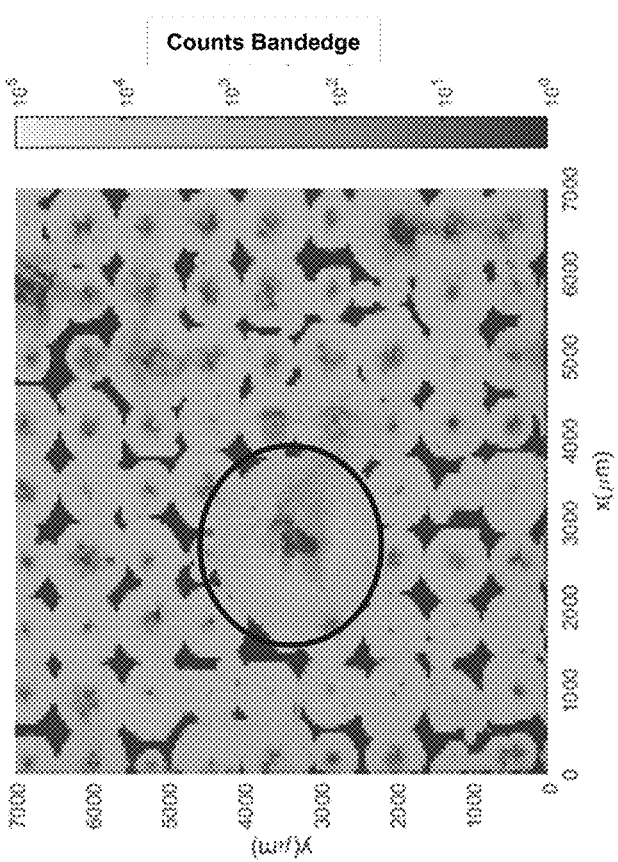

FIG. 16A depicts a PL map of the intensity of the band edge peak with a corresponding $A_1(LO)$ Raman map being shown in FIG. 16B. In the PL map, there are areas of high bandage that correspond to conductive (high $A_1$(LO) peak position). This is expected since a larger band edge peak will occur when more electrons are in the conduction band. However, the many at the center of the conductive circles with low band edge intensity. This suggests these regions have an n-type defect that increase the conductivity over long ranges suggesting that samples at the center of conductive regions will be lower quality. This has been experimentally confirmed (see, e.g., FIGS. 11A-11B and 12A-12B).

Thus, the present invention uses Raman spectroscopy to screen wafers for Raman devices by monitoring the $A_1$(LO), $A_1$(TO), and $E_2$ peaks over a large area Raman map. Complementary PL images can aid in determining whether the defects are conductive or insulating. From this the substrate can be categorized as Type I, Type II-a, or Type II-b. Type I wafers are mostly uniform and will get high device yield, Type II-a wafers have a regular pattern of defects, which can be avoided during fabrication to increase yield, while Type II-b wafers have a random array of defects making low yield likely. Critical device parameters such as reverse leakage current, forward turn-on voltage, specific ON-resistance, and current handling capability can be predicted based on information about the Raman peak analysis, using signatures such as position, full width at half maximum, peak intensity, or ratios of these parameters among groups of peaks.

In accordance with the present invention, a predetermined threshold can be applied to the Raman data to select regions suitable for a device with specified electrical properties. Software can use this information to bin the Raman data and estimate the device yield, and device fabrication on wafers with low yield estimates can be avoided, potentially saving time and money.

Similarly, photoluminescence spectroscopy analysis can be used to map band-edge peak intensity, specific defect band position and intensity, and the ratio of such peaks. Critical device parameters such as reverse leakage current, forward turn-on voltage, specific ON-resistance, and current handling capability can be predicted based on information about the spectra. Pre-determined thresholds can be applied to this data to select regions suitable for a device with specified electrical properties. The photoluminescence can also be imaged utilizing a color or black and white CCD camera. It is possible to produce a similar photoluminescence map by imaging utilizing band pass filters to select specific band-edge and defect peaks. Pre-determined thresholds for pixel intensity at a given wavelength or ratio of pixel intensity of images at multiple wavelengths can be applied to this data to select regions suitable for a device with specified electrical properties.

While the present invention has been described and illustrated in the context of specific embodiments, aspects, and features, one skilled in the art would readily appreciate that the invention described herein is not limited to only those embodiments, aspects, and features but also contemplates any and all modifications and alternative embodiments that are within the spirit and scope of the underlying invention described and claimed herein. The present disclosure contemplates any and all modifications within the spirit and scope of the underlying invention described and claimed herein, and all such modifications and alternative embodiments are deemed to be within the scope and spirit of the present invention.

What is claimed is:

1. A method for identifying a density of defects in a GaN sample, the method including the steps of:

performing Raman spectroscopy at a predetermined plurality of locations on a surface of the GaN sample;

receiving, at a processor programmed with appropriate software, data of an $E_2$ peak wavenumber associated with an $E_2$ phonon peak of the GaN sample at each of the plurality of locations on the GaN sample surface, the $E_2$ peak wavenumber at each location being indicative of a determinable density of defects within the GaN sample at that location; and using the processor, generating a map of the GaN sample surface, the map providing an indicia of the $E_2$ peak wavenumber at each of the plurality of locations on the GaN sample surface;

wherein the map provides an indicia of the density of defects at each of the plurality of locations in the GaN sample.

2. A method for identifying a density of charge carriers in a GaN sample, the method including the steps of:

performing Raman spectroscopy at a predetermined plurality of locations on a surface of the GaN sample;

receiving, at a processor programmed with appropriate software, data of an $A_1$(LO) peak wavenumber associated with an $A_1$(LO) phonon peak of the GaN sample at each of the plurality of locations on the GaN sample surface, the $A_1$(LO) peak wavenumber at each location being indicative of a determinable density of charge carriers within the GaN sample at that location; and using the processor, generating a map of the GaN sample surface, the map providing an indicia of the $A_1$(LO) peak wavenumber at each of the plurality of locations on the GaN sample surface;

wherein the map provides an indicia of the density of charge carriers at each of the plurality of locations in the GaN sample.

3. A method for identifying a presence of grain boundaries in a GaN sample, the method including the steps of:

performing Raman spectroscopy at on a predetermined plurality of locations on a surface of the GaN sample;

receiving, at a processor programmed with appropriate software, data of an $A_1$(TO) peak wavenumber associated with an $A_1$(TO) phonon peak of the GaN sample at each of the plurality of locations on the GaN sample surface, the $A_1$(TO) peak wavenumber at each location being indicative of a presence of at least one grain boundary within the GaN sample at that location; and using the processor, generating a map of the GaN sample surface, the map providing an indicia of the $A_1$(TO) peak wavenumber at each of the plurality of locations on the GaN sample surface;

wherein the map provides an indicia of a location of the at least one grain boundary in the GaN sample.

4. A method for identifying at least one area on a surface of a GaN sample suitable for electronic device fabrication, the method including the steps of:

performing Raman spectroscopy at a predetermined plurality of locations on the surface of the GaN sample;

for each of the plurality of locations on the GaN sample surface, receiving, at a processor programmed with appropriate software, data of at least one of an $E_2$ peak wavenumber associated with an $E_2$ phonon peak of the GaN sample, an $A_1$(LO) peak wavenumber associated with an $A_1$(LO) phonon peak of the GaN sample, and an $A_1$(TO) peak wavenumber associated with an $A_1$(TO) phonon peak of the GaN sample, the $E_2$ peak wavenumber at each location being indicative of a determinable density of defects within the GaN sample at that location, the $A_1(LO)$ peak wavenumber at each location being indicative of a determinable density of charge carriers within the GaN sample at that location, and the $A_1(TO)$ peak wavenumber at each location being indicative of a presence of at least one grain boundary within the GaN sample at that location;

using the processor, generating at least one map of the GaN sample surface, the map providing an indicia of the $E_2$, $A_1(LO)$, or $A_1(TO)$ peak wavenumber at each of the plurality of locations on the GaN substrate surface; and using the generated map, identifying areas of the GaN sample surface satisfying at least one predetermined defect density, charge carrier concentration, or grain boundary density criterion for fabrication of a predetermined electronic device on the GaN substrate.

5. The method according to claim 4, further including the step of determining a size of the predetermined electronic device that can be fabricated on the area on the GaN substrate surface satisfying the at least one predetermined defect density, charge carrier concentration, or grain boundary density criterion.

6. The method according to claim 4, further including the step of determining a number of the predetermined electronic devices that can be fabricated on the area on the GaN substrate surface satisfying the at least one predetermined defect density, charge carrier concentration, or grain boundary density criterion.

7. The method according to claim 4, further including the step of determining a placement of at least one of the predetermined electronic device that can be fabricated on the area on the GaN substrate surface satisfying the at least one predetermined defect density, charge carrier concentration, or grain boundary density criterion.

8. A method for identifying a conductivity of a GaN sample, the method including the steps of:

performing photoluminescence (PL) spectroscopy at a predetermined plurality of locations on a surface of the GaN sample;

receiving, at a processor programmed with appropriate software, data of a wavenumber at which the photoluminescence spectroscopy exhibits a peak intensity at each of the plurality of locations on the GaN surface, the wavenumber having the peak intensity being indicative of a determinable conductivity of the GaN sample at that location; and using the processor, generating a map of the GaN sample surface, the map providing an indicia of the wavenumber having the peak intensity at each of the plurality of locations on the GaN sample surface;

wherein the map provides an indicia of the conductivity at each of the plurality of locations in the GaN sample.

9. A method for identifying at least one area on a surface of a GaN sample suitable for electronic device fabrication, the method including the steps of:

performing photoluminescence (PL) spectroscopy at a predetermined plurality of locations on a surface of the GaN sample;

receiving, at a processor programmed with appropriate software, data of a wavenumber at which the photoluminescence spectroscopy exhibits a peak intensity at each of the plurality of locations on the GaN surface, the wavenumber having the peak intensity being indicative of a determinable conductivity of the GaN sample at that location; and using the processor, generating a map of the GaN sample surface, the map providing an indicia of the wavenumber having the peak intensity at each of the plurality of locations on the GaN sample surface;

wherein the map provides an indicia of the conductivity at each of the plurality of locations in the GaN sample; and using the generated map, identifying areas of the GaN sample surface satisfying a predetermined conductivity criterion for fabrication of a predetermined electronic device on the GaN substrate.

10. The method according to claim 9, further including the step of determining a size of the predetermined electronic device that can be fabricated on the area on the GaN substrate surface satisfying the predetermined conductivity criterion.

11. The method according to claim 9, further including the step of determining a number of the predetermined electronic devices that can be fabricated on the area on the GaN substrate surface satisfying the predetermined conductivity criterion.

12. The method according to claim 9, further including the step of determining a placement of at least one of the predetermined electronic device that can be fabricated on the area on the GaN substrate surface satisfying the predetermined conductivity criterion.

* * * * *